United States Patent
Minegishi et al.

(10) Patent No.: US 8,298,747 B2
(45) Date of Patent: Oct. 30, 2012

(54) PHOTOSENSITIVE RESIN COMPOSITION, PROCESS FOR PRODUCING PATTERNED HARDENED FILM WITH USE THEREOF AND ELECTRONIC PART

(75) Inventors: Tomonori Minegishi, Ibaraki (JP); Rika Nogita, Ibaraki (JP); Kenichi Iwashita, Ibaraki (JP)

(73) Assignee: Hitachi Chemical Dupont Microsystems, Ltd., Tokyo (JP)

( * ) Notice: Subject to any disclaimer, the term of this patent is extended or adjusted under 35 U.S.C. 154(b) by 364 days.

(21) Appl. No.: 12/531,055

(22) PCT Filed: Mar. 6, 2008

(86) PCT No.: PCT/JP2008/054008
§ 371 (c)(1),
(2), (4) Date: Sep. 11, 2009

(87) PCT Pub. No.: WO2008/111470
PCT Pub. Date: Sep. 18, 2008

(65) Prior Publication Data
US 2010/0092879 A1    Apr. 15, 2010

(30) Foreign Application Priority Data

Mar. 12, 2007  (JP) .................................. 2007-062342
Oct. 31, 2007  (JP) .................................. 2007-283396

(51) Int. Cl.
G03F 7/00 (2006.01)
G03F 7/004 (2006.01)
G03F 7/027 (2006.01)
G03F 7/028 (2006.01)
G03F 7/40 (2006.01)

(52) U.S. Cl. ............... 430/270.1; 430/281.1; 430/286.1; 430/905; 430/913; 430/927; 430/330; 430/331

(58) Field of Classification Search ............... 430/270.1, 430/281.1, 286.1, 905, 913, 927, 330, 331, 430/311
See application file for complete search history.

(56) References Cited

U.S. PATENT DOCUMENTS

| | | | |
|---|---|---|---|
| 3,957,512 A | 5/1976 | Kleeberg et al. | |
| 4,040,831 A | 8/1977 | Rubner et al. | |
| 4,093,461 A | 6/1978 | Loprest et al. | |
| RE30,186 E | 1/1980 | Rubner et al. | |
| 4,339,521 A | 7/1982 | Ahne et al. | |
| 4,395,482 A | 7/1983 | Ahne et al. | |
| 4,629,777 A | 12/1986 | Pfeifer | |
| 4,657,832 A | 4/1987 | Pfeifer | |
| 4,927,736 A | 5/1990 | Mueller et al. | |
| 5,019,488 A | 5/1991 | Mammato et al. | |
| 5,037,720 A | 8/1991 | Khanna | |
| 5,106,720 A | 4/1992 | Mueller et al. | |
| 5,342,739 A | 8/1994 | Katou et al. | |
| 5,486,447 A | 1/1996 | Hammerschmidt et al. | |
| 5,738,915 A | 4/1998 | Fathi et al. | |
| 6,143,467 A | 11/2000 | Hsu et al. | |
| 6,338,931 B1 | 1/2002 | Maeda et al. | |
| 6,576,394 B1 | 6/2003 | Xu et al. | |
| 6,884,567 B2 * | 4/2005 | Sezi ........................... 430/283.1 |
| 6,887,643 B2 | 5/2005 | Fujita et al. | |
| 6,929,891 B2 | 8/2005 | Rushkin et al. | |
| 6,933,087 B2 | 8/2005 | Suwa et al. | |
| 7,049,371 B2 * | 5/2006 | Enoki et al. .................... 525/183 |
| 7,129,011 B2 * | 10/2006 | Rushkin et al. ................. 430/18 |
| 7,132,205 B2 * | 11/2006 | Rushkin et al. ................. 430/18 |
| 7,435,525 B2 | 10/2008 | Hattori et al. | |
| 7,485,405 B2 | 2/2009 | Kato et al. | |
| 7,615,331 B2 | 11/2009 | Yamanaka et al. | |
| 7,803,510 B2 * | 9/2010 | Naiini et al. ................... 430/190 |
| 2001/0031419 A1 | 10/2001 | Nunomura et al. | |
| 2002/0115741 A1 | 8/2002 | Kobayashi et al. | |
| 2003/0022109 A1 | 1/2003 | Kobayashi | |
| 2003/0194631 A1 | 10/2003 | Suwa et al. | |
| 2004/0110084 A1 | 6/2004 | Inomata et al. | |
| 2004/0142275 A1 | 7/2004 | Komatsu | |

(Continued)

FOREIGN PATENT DOCUMENTS

JP    SHO49011551    2/1974

(Continued)

OTHER PUBLICATIONS

Machine translation of JP 2007-322935 (no date).*
Machine translation of JP 2002-249646(no date).*
Okuda, R., et al., "Polyimide Coatings for OLED Applications," Journal of Photopolymer Science and Technology, vol. 17, No. 2, 2004, pp. 207-214.
International Search Report, issued in corresponding application No. PCT/JP2008/054008, completed Mar. 21, 2008, mailed Apr. 1, 2008.

(Continued)

Primary Examiner — Amanda C. Walke
(74) Attorney, Agent, or Firm — Griffin & Szipl, P.C.

(57) ABSTRACT

To provide a photosensitive resin composition in which a hardened film obtained from the photosensitive resin composition has properties comparable to those of a film hardened at a high temperature, a method for manufacturing a patterned hardened film using the photosensitive resin composition, and an electronic part. The photosensitive resin composition includes (a) a polybenzoxazole precursor having a repeating unit represented by a general formula (I):

$$\left(\!\!\begin{array}{c}\text{HN}\end{array}\!\!-\!\!\bigcirc\!\!-\!\!U\!\!-\!\!\bigcirc\!\!-\!\!\text{NH}\!\!-\!\!\overset{\text{O}}{\underset{\|}{\text{C}}}\!\!-\!\!V\!\!-\!\!\overset{\text{O}}{\underset{\|}{\text{C}}}\!\!\right) \quad (I)$$
$$\text{HO} \qquad \text{OH}$$

wherein U and V represent a divalent organic group, and at least one of U and V is a group containing an aliphatic chain structure having 1 to 30 carbon atoms; (b) a photosensitizer; (c) a solvent; and (d) a crosslinking agent capable of causing crosslinking or polymerization by heating.

24 Claims, 3 Drawing Sheets

U.S. PATENT DOCUMENTS

| | | |
|---|---|---|
| 2004/0229166 A1 | 11/2004 | Rushkin et al. |
| 2004/0253537 A1 | 12/2004 | Rushkin et al. |
| 2006/0079658 A1 | 4/2006 | Kato et al. |
| 2006/0110680 A1 | 5/2006 | Taniguchi et al. |
| 2006/0199920 A1 | 9/2006 | Okada et al. |
| 2007/0122733 A1* | 5/2007 | Hattori et al. ............ 430/141 |

FOREIGN PATENT DOCUMENTS

| | | |
|---|---|---|
| JP | 49-115541 | 11/1974 |
| JP | 51-40922 | 4/1976 |
| JP | 52-13315 A | 2/1977 |
| JP | 54-145794 | 11/1979 |
| JP | 56-038038 | 4/1981 |
| JP | 59108031 | 6/1984 |
| JP | 59-132122 | 7/1984 |
| JP | 59-220730 A | 12/1984 |
| JP | 59-231533 A | 12/1984 |
| JP | 59-232122 A | 12/1984 |
| JP | 59219330 | 12/1984 |
| JP | 60-006729 A | 1/1985 |
| JP | 60-072925 A | 4/1985 |
| JP | 61-057620 A | 3/1986 |
| JP | 64-46862 | 3/1989 |
| JP | 64060630 | 3/1989 |
| JP | 1-46862 B2 | 10/1989 |
| JP | 03-000763 A | 1/1991 |
| JP | 3-58048 | 3/1991 |
| JP | 3-259148 | 11/1991 |
| JP | 04-031861 A | 2/1992 |
| JP | 04-046345 A | 2/1992 |
| JP | 5-410922 | 6/1993 |
| JP | 05-197153 A | 8/1993 |
| JP | 6-157620 | 6/1994 |
| JP | 07-219228 A | 8/1995 |
| JP | 2587148 | 12/1996 |
| JP | 09-183846 A | 7/1997 |
| JP | 10-186664 A | 7/1998 |
| JP | 10-195294 | 7/1998 |
| JP | 10-282668 A | 10/1998 |
| JP | 10-307393 A | 11/1998 |
| JP | 11-149161 | 6/1999 |
| JP | 11-153866 A | 6/1999 |
| JP | 11-202488 | 7/1999 |
| JP | 11-202489 A | 7/1999 |
| JP | 11-254850 A | 9/1999 |
| JP | 3031434 | 2/2000 |
| JP | 2000-147764 A1 | 5/2000 |
| JP | 2000-199957 | 7/2000 |
| JP | 2000-250209 | 9/2000 |
| JP | 2001-033964 A | 2/2001 |
| JP | 2001-056559 A | 2/2001 |
| JP | 2001-125267 A | 5/2001 |
| JP | 2001-183835 A | 7/2001 |
| JP | 2001-194791 A | 7/2001 |
| JP | 2001-249454 | 9/2001 |
| JP | 2001-255666 A | 9/2001 |
| JP | 2001-312051 | 11/2001 |
| JP | 2002-139835 A | 5/2002 |
| JP | 2002-169286 A | 6/2002 |
| JP | 2002-526793 A | 8/2002 |
| JP | 2002-249646 | 9/2002 |
| JP | 2002-328472 | 11/2002 |
| JP | 2003-121998 A | 4/2003 |
| JP | 2003-215802 A | 7/2003 |
| JP | 2004-503830 A | 2/2004 |
| JP | 2004-94118 | 3/2004 |
| JP | 2004-219813 A | 8/2004 |
| JP | 2004-325616 A | 11/2004 |
| JP | 2006-133757 A | 5/2006 |
| JP | 2006-178059 | 7/2006 |
| JP | 2006-189788 | 7/2006 |
| JP | 2006-349700 | 12/2006 |
| JP | 2007-212602 | 8/2007 |
| JP | 2007-246440 | 9/2007 |
| JP | 2007322935 A * | 12/2007 |
| WO | 00-19273 | 4/2000 |
| WO | 01-96960 A1 | 12/2001 |
| WO | 2004/081664 A2 | 9/2004 |
| WO | WO 2005109099 A1 * | 11/2005 |
| WO | 2007-034604 | 3/2007 |

OTHER PUBLICATIONS

Yoshio Imai et al., "Saishin Polyimide-Kiso To Ouyou," Nippon Polyimide Kenkyukai, citing Characteristics of Polyimide as Electronic Material, Jan. 2002.

Shigeru Kubota et al, "Positive Photoreactive Polyimides., II. Preparation and Characterization of Polyimide Precursors Containing . . . ," J. Macromol, Sci.-Chem., A24 (12) pp. 1407-1422, (1987).

Shigeru Kubota et al., "Positive Photoreactive Polyimides. II. Preparation and Characterization of Polyimide Precursors Containing α-[2-Nitrophenyl]Ethyl Ester Side Chains," J. Macromol. Sci.-Chem., A24 (12), pp. 1407-1422, (1987).

Toshihiko Omote et al., "Fluorine-Containing Photoreactive Polyimides. 7, Photochemical Reaction of Pendant 1,2-Naphthoquinone Diazide Moieties in Novel Photoreactive Polyimides," Macromolecules 1990, 23, pp. 4796-4802.

International Search Report issued in the corresponding Japanese Application No. PCT/JP2006/312357, completed Jul. 12, 2006 and mailed on Jul. 25, 2006.

Written Opinion of the International Searching Authority (PCT/ISA/237) issued in corresponding application No. PCT/JP2006/312357 dated Jul. 25, 2006.

International Search Report issued in corresponding application No. PCT/JP2006/312358, completed Aug. 10, 2006 and mailed Aug. 22, 2006.

International Search Report, issued in corresponding application No. PCT/JP2008/069652, completed Nov. 18, 2008, mailed Dec. 2, 2008.

Office Action in co-pending U.S. Appl. No. 12/067,911 mailed Jun. 8, 2011.

Office Action in U.S. Appl. No. 13/305,668 mailed Oct. 17, 2011.

Ueda, Mitsuru, et al. "A New Negative-Type Photosensitive Polyimide Based on Poly(hydroxyimide), a Cross-Linker, and a Photoacid Generator," Macromolecules, 29, 1996, pp. 6427-6431.

Watanabe, Yasufumi et al., "Three-Component Negative-Type Photosensitive Polyimide Precursor Based on Poly(amid acid), a Crosslinker, and a Photoacid Generator," Journal of Polymer Science: Part A: Polymer Chemistrym vol. 43, 2005, pp. 593-599.

Watanabe, Yasufumi, et al. "New Negative-Type Photosensitive Alkaline-developable Semi-aromatic Polymides with Low Dielectric Constants Based on Poly(amic acid) from Aromatic Diamine Containing Adamantyl Units and Alicyclic Dianhydrides, a Cross-linker, and a Photoacid Generator," Polymer Journal, vol. 37, 2005, pp. 270-276.

Office Action of U.S. Appl. No. 12/067,911, dated Sep. 17, 2010, Exhibit A.

Office Action issued on Dec. 16, 2011 in co-pending U.S. Appl. No. 12/067,911.

Office Action issued on Jan. 30, 2012 in co-pending U.S. Appl. No. 12/305,668.

Espacenet Bibliographic data corresponding to JP 2007-322935 (2008), last updated Mar. 14, 2012 (filed concurrently herewith as Exhibit A1 to Amendment B).

Espacenet Bibliographic data corresponding to the JP 2002-249646, last updated Mar. 14, 2012 (filed concurrently herewith as Exhibit B1 to Amendment B).

JP 2002-249646 A (filed concurrently herewith as Exhibit C1 to Amendment B).

Extended European Search Report issued in corresponding application 08721728.4, completed Jun. 29, 2012 and mailed Jul. 11, 2012.

Office Action issued on May 11, 2012 in co-pending U.S. Appl. No. 12/739,127.

Final Office Action issued in co-pending related U.S. Appl. No. 13/006,300 on Sep. 5, 2012.

Office Action issued in co-pending U.S. Appl. No. 12/067,911 on Aug. 20, 2012.

* cited by examiner

US 8,298,747 B2

PHOTOSENSITIVE RESIN COMPOSITION, PROCESS FOR PRODUCING PATTERNED HARDENED FILM WITH USE THEREOF AND ELECTRONIC PART

This is a National Phase Application in the United States of International Patent Application No. PCT/JP2008/054008 filed Mar. 6, 2008, which claims priority on Japanese Patent Application No. 2007-062342, filed Mar. 12, 2007, and on Japanese Patent Application No. 2007-283396, filed Oct. 31, 2007. The entire disclosures of the above patent applications are hereby incorporated by reference.

TECHNICAL FIELD

The present invention relates to a positive photosensitive resin composition containing a polybenzoxazole precursor and having excellent heat resistance, a method for manufacturing a patterned hardened film using the photosensitive resin composition, and an electronic part. More particularly, the present invention relates to a positive photosensitive resin composition that is excellent in sensitivity, resolution, adhesion during development, heat resistance, and resistance to chemicals, and from which a pattern having a favorable form can be obtained, a method for manufacturing a patterned hardened film using the photosensitive resin composition, and an electronic part.

BACKGROUND ART

Conventionally, in a surface protecting film or interlayer inslating film of a semiconductor device, a polyimide resin having excellent heat resistance and high electric and mechanical properties has been used. In general, a film of the polyimide resin is formed by reacting a tetracarboxylic acid dianhydride with a diamine in a polar solvent at room temperature under atmospheric pressure, applying the resultant polyimide precursor (polyamidic acid) solution (so-called varnish) by spin coating or the like to form a thin film, and subjecting the thin film to thermal cyclodehydration (hardening) (see, for example, Nonpatent Document 1).

In recent years, a photosensitive polyimide obtained by imparting photosensitive properties to the polyimide resin has been used. The use of the photosensitive polyimide has a characteristic in that a patterning step can be simplified, making it possible to shorten a cumbersome process for pattern formation (see, for example, Patent Documents 1 to 3).

In development process of the photosensitive polyimide, an organic solvent such as N-methylpyrrolidone has conventionally been used. However, recently, from the viewpoint of environmental burden and cost, there has been proposed a positive photosensitive resin that can be developed using an alkaline aqueous solution. As examples of methods for obtaining a positive photosensitive resin that can be developed using an alkaline aqueous solution, there can be mentioned a method in which an o-nitrobenzyl group is introduced to a polyimide precursor via an ester linkage (see, for example, Nonpatent Document 2), and a method in which a naphthoquinonediazide compound is mixed into soluble hydroxylimide or a polybenzoxazole precursor (see, for example, Patent Documents 4 and 5). Resins obtained by the aforementioned methods can be expected to achieve reduced permittivity, and also from this viewpoint, the photosensitive polybenzoxazole has attracted attention as well as the photosensitive polyimide.

Recently, as a process for forming a resin hardened film, such as an interlayer inslating-film layer or surface-protecting film layer for an electronic part, a low temperature process is desired. In order to meet such a demand, a polyimide or polybenzoxazole therefor is required to have capability of being cyclodehydrated at a low temperature and capability of giving properties to the resulting film after the cyclodehydration comparable to the properties of a film obtained by cyclodehydration at a high temperature. However, when the polyimide precursor or polybenzoxazole precursor is subjected to thermal cyclodehydration to form a polyimide thin film or a polybenzoxazole thin film, the cyclodehydration generally needs a temperature as high as about 350° C. Such a high temperature of about 350° C. possibly adversely affects the substrate. In order to avoid defects caused due to the heat history, it has recently been desired to lower the temperature for treatment in a semiconductor manufacturing process. In order to achieve a lowered treatment temperature in the process, even with respect to the surface protecting film, a polyimide material or polybenzoxazole material therefor is required to have capability of being cyclodehydrated at a temperature as low as less than about 250° C., which is lower than the high temperature of about 350° C. conventionally employed, and capability of giving properties to the resulting film after the cyclodehydration comparable to those of a film obtained by cyclodehydration at a high temperature. However, when the cyclodehydration is performed using a thermal diffusion oven at a low temperature, the resultant film generally has poor properties.

It is known that the cyclodehydration temperature for a polybenzoxazole precursor is generally higher than the cyclodehydration temperature for a polyimide precursor (see, for example, J. Photopolym. Sci. Technol., vol. 17, pp. 207-213). Therefore, cyclodehydration of the polybenzoxazole precursor at a temperature of lower than 250° C. is more difficult than cyclodehydration of the polyimide precursor.

Patent Document 1: Japanese Patent Application Laid-open No. S49-11551 A
Patent Document 2: Japanese Patent Application Laid-open No. S59-108031 A
Patent Document 3: Japanese Patent Application Laid-open No. S59-219330 A
Patent Document 4: Japanese Patent Application Laid-open No. S64-60630 A
Patent Document 5: U.S. Pat. No. 4,395,482
Nonpatent Document 1: Nippon Polyimide Kenkyukai (Japan Polyimide Study Group) "Saishin Polyimide—Kiso to Ouyou—(Latest polyimide—Basics and Applications—)" (2002)
Nonpatent Document 2: J. Macromol. Sci., Chem., vol. A24, 12, 1407 (1987)

DISCLOSURE OF INVENTION

Problem to be Solved by the Invention

After being patterned, the photosensitive polyimide or photosensitive polybenzoxazole is hardened generally at a temperature as high as about 350° C. Meanwhile, a recently developed MRAM (Magnet Resistive RAM), which is a promising next-generation memory, is not durable in a high temperature process, and a low temperature process for the MRAM has been desired. Therefore, a buffer coat (surface protecting film) material is required to have capability of being hardened at a temperature as low as not more than about 280° C., which is lower than the high temperature of about 350° C. conventionally employed, and capability of giving properties to the hardened film at such a low temperature comparable to the properties of a film hardened at a high temperature. However, there is a problem that a buffer coat material, in which the material can be hardened at such a low temperature and a film of the material hardened at the low temperature has properties comparable to those of a film hardened at a high temperature, has not been obtained yet.

The present invention has been achieved to solve the aforementioned problems of prior art, and an object of the invention is to provide a photosensitive resin composition in which, by having as a base resin a polybenzoxazole photosensitive resin film having a specific structure unit exhibiting a high cyclodehydration rate even at 280° C. or lower, a hardened film of the resin composition has properties comparable to those of a film hardened at a high temperature, a method for manufacturing a patterned hardened film using the photosensitive resin composition, and an electronic part.

Means for Solving Problem

In order to solve the aforementioned problems, the photosensitive resin composition according to the present invention comprises, as a base polymer, a photosensitive polybenzoxazole precursor that can be developed using an alkaline solution, in which, as in the general formula (I) or (V) shown below for the photosensitive polybenzoxazole, at least one of U and V have an aliphatic chain structure. The polybenzoxazole precursor having such a structure exhibits high cyclodehydration rate even at about 280° C. or lower. Therefore, by using this resin composition, even in a hardening process at a lower temperature, there can be obtained a hardened film having high heat resistance and properties comparable to those of a film hardened at a high temperature.

The polybenzoxazole hardened film having an aliphatic chain structure has high breaking extension, low electrical permittivity, and excellent resistance to chemicals, even if the film is formed in a hardening process at a lower temperature. In the present invention, the use of the aforementioned photosensitive resin composition enables development using an alkaline aqueous solution and the polybenzoxazole precursor having an aliphatic chain structure has high light transmission properties. Therefore the material enables a method for manufacturing a patterned hardened film, in which the sensitivity and resolution are excellent and a patterned hardened film having excellent heat resistance and a favorable form can be obtained even in a low temperature hardening process at equal to or lower than 280° C.

Further, in the present invention, use of the photosensitive resin composition made in a pattern having a favorable form and properties, which can be hardened in a low temperature process, enables suppression of damages to a device, and thus enables provision of an electronic part with high reliability and high yield.

That is, the photosensitive resin composition for low temperature hardening of the present invention comprises: (a) a polybenzoxazole precursor having a repeating unit represented by a general formula (I):

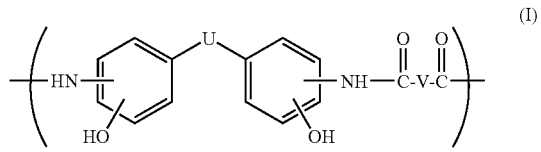

wherein U and V represent a divalent organic group, and at least one of U and V is a group containing an aliphatic chain structure having 1 to 30 carbon atoms; (b) a photosensitizer;
(c) a solvent; and (d) a crosslinking agent capable of causing crosslinking or polymerization by heating.

In the photosensitive resin composition of the present invention, in the general formula (I) for the component (a), at least one of U and V may be a group having a structure represented by a general formula (UV1):

wherein each of $R^1$ and $R^2$ independently represents hydrogen, fluorine, or an alkyl group having 1 to 6 carbon atoms, and a' represents an integer of 1 to 30, or a group having a structure represented by a general formula (UV2):

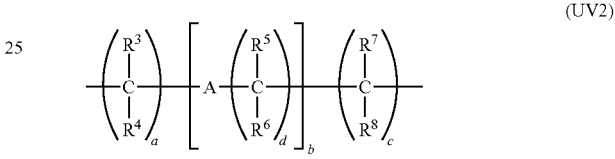

wherein each of $R^3$ to $R^8$ independently represents hydrogen, fluorine, or an alkyl group having 1 to 6 carbon atoms; each of a to c independently represents an integer of 1 to 6; d represents an integer of 0 to 3; and A represents —O—, —S—, —SO$_2$—, —CO—, —NHCO—, —C(CF$_3$)$_2$—, —C≡C—, or —R$^9$C═CR$^{10}$—wherein each of $R^9$ and $R^{10}$ independently represents hydrogen, fluorine, or an alkyl group having 1 to 6 carbon atoms.

In the photosensitive resin composition of the present invention, the component (a) may be a polybenzoxazole precursor having a repeating unit represented by a general formula (II):

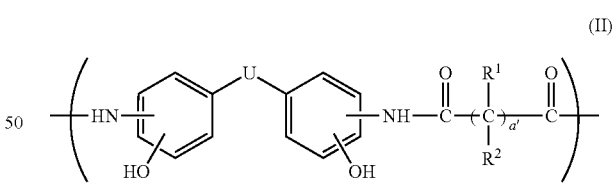

wherein each of $R^1$ and $R^2$ independently represents hydrogen, fluorine, or an alkyl group having 1 to 6 carbon atoms, U represents a divalent organic group, and a' represents an integer of 1 to 30.

In the photosensitive resin composition of the present invention, in the general formula (II) for the component (a), a' may be 7 to 30.

As another aspect, a photosensitive resin composition for low temperature hardening of the present invention comprises: (a) a copolymer of a polybenzoxazole precursor having an A structure unit and a B structure unit represented by a general formula (III):

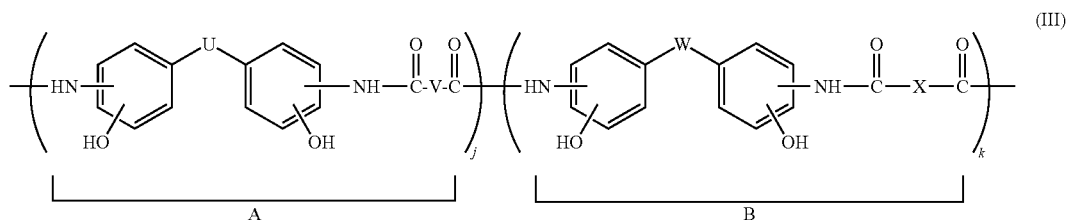

wherein each of U, V, W, and X represents a divalent organic group, at least one of U and V is a group containing an aliphatic chain structure having 1 to 30 carbon atoms, j and k represent molar fractions of the A structure unit and the B structure unit, respectively, and the sum of j and k is 100 mol %; (b) a photosensitizer; (c) a solvent; and (d) a crosslinking agent capable of causing crosslinking or polymerization by heating.

In the photosensitive resin composition of the present invention, in the general formula (III) for the component (a), at least one of U and V may be a group having a structure represented by a general formula (UV1):

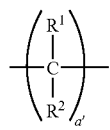

wherein each of $R^1$ and $R^2$ independently represents hydrogen, fluorine, or an alkyl group having 1 to 6 carbon atoms, and a' represents an integer of 1 to 30, or a group having a structure represented by a general formula (UV2):

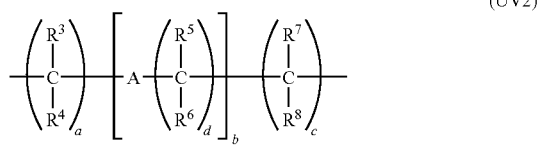

wherein each of $R^3$ to $R^8$ independently represents hydrogen, fluorine, or an alkyl group having 1 to 6 carbon atoms; each of a to c independently represents an integer of 1 to 6; d represents an integer of 0 to 3; and A represents —O—, —S—, —$SO_2$—, —CO—, —NHCO—, —$C(CF_3)_2$—, —C≡C—, or —$R^9C$=$CR^{10}$— wherein each of $R^9$ and $R^{10}$ independently represents hydrogen, fluorine, or an alkyl group having 1 to 6 carbon atoms.

In the photosensitive resin composition for low temperature hardening of the present invention, the component (a) may be represented by a general formula (IV):

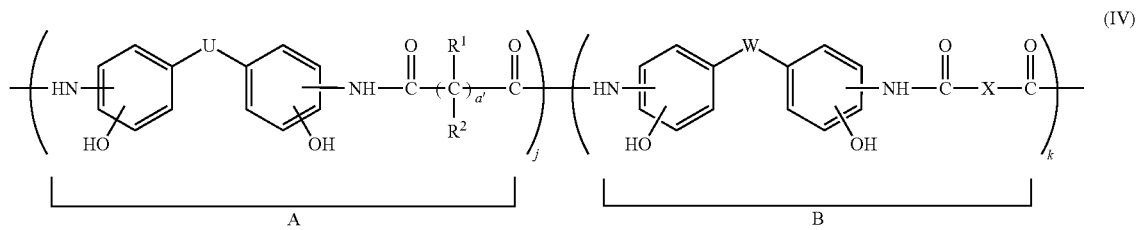

independently wherein each of $R^1$ and $R^2$ independently represents hydrogen, fluorine, or an alkyl group having 1 to 6 carbon atoms, each of U, W, and X represents a divalent organic group, j and k represent molar fractions of the A structure unit and the B structure unit, respectively, the sum of j and k is 100 mol %, and a' represents an integer of 1 to 30.

In the photosensitive resin composition of the present invention, in the general formula (IV) for the component (a), a' may be 7 to 30.

In the photosensitive resin composition of the present invention, the component (b) may be a photosensitizer that generates acid or radicals by irradiation with light.

In the photosensitive resin composition of the present invention, the component (d) may be a compound having a methylol group or an alkoxyalkyl group.

The photosensitive resin composition of the present invention may further comprise as a component (e) a thermal acid generator that generates acid by heating.

The polybenzoxazole film of the present invention is formed using the aforementioned photosensitive resin composition by cyclodehydration of the polybenzoxazole precursor contained in the photosensitive resin composition.

The method for manufacturing a patterned hardened film of the present invention comprises: a photosensitive-resin-film forming step of applying the photosensitive resin composition according to claim 14 to a substrate and drying the resin composition, to form a photosensitive resin film; an light-exposing step of subjecting the photosensitive resin film to light exposure with a predetermined pattern; a developing step of, after the light exposure, developing the photosensitive resin film using an alkaline aqueous solution to obtain a patterned resin film; and a heating treatment step of subjecting the patterned resin film to heating treatment to obtain a patterned hardened film.

In the method for manufacturing a patterned hardened film of the present invention, the heating treatment step may be performed by irradiating the patterned resin film with a microwave in a pulse form while changing a frequency of the microwave.

In the method for manufacturing a patterned hardened film of the present invention, at the heating treatment step of the developed photosensitive resin film, a heating treatment temperature may be equal to or less than 280° C.

In the method for manufacturing a patterned hardened film of the present invention, at the heating treatment step of the developed photosensitive resin film, a heating treatment temperature may be equal to or less than 230° C.

The electronic part of the present invention has a patterned hardened film obtained by the aforementioned method for manufacturing a patterned hardened film as at least one of an interlayer inslating-film layer and a surface-protecting film layer.

The electronic part of the present invention may be a magnetoresistive memory.

Effect of the Invention

After being patterned, the polybenzoxazole precursor conventionally used as a base resin for a photosensitive resin composition is required to be hardened at a temperature as high as about 350° C. for cyclodehydration. On the other hand, the photosensitive resin composition according to the present invention has, as a base resin, a specific polybenzoxazole photosensitive resin film exhibiting high cyclodehydration rate even as a result of hardening at 280° C. or lower. Consequently, a hardened film of the resin composition has properties comparable to those of a film hardened at a high temperature. Therefore, a cyclization reaction or hardening reaction efficiently proceeds at a lower temperature. Further, the photosensitive resin composition according to the present invention causes a difference in the dissolution speed (dissolution contrast) in a developer liquid between a light-exposed portion and an unexposed portion, making it possible to surely form a desired pattern.

In the method for manufacturing a patterned hardened film according to the present invention, use of the aforementioned photosensitive resin composition enables production of a pattern that is advantageous not only in that it has excellent sensitivity, resolution, and adhesion, but also in that, even formed in a low temperature hardening process, the pattern has excellent heat resistance, low water absorption, and a favorable form.

Furthermore, in the electronic part according to the present invention, a hardened film as a constituent element is formed using the photosensitive resin composition according to the present invention. Therefore the electronic part has a patterned hardened film having a favorable form and excellent in adhesion and heat resistance. Further, in the electronic part according to the present invention, the hardened film can be formed in a low temperature process and hence damages to a device can be suppressed, and therefore the electronic part has high reliability. Further, damages to the device in the process can be suppressed, and therefore the electronic part according to the present invention advantageously has high production yield.

Figure 1:
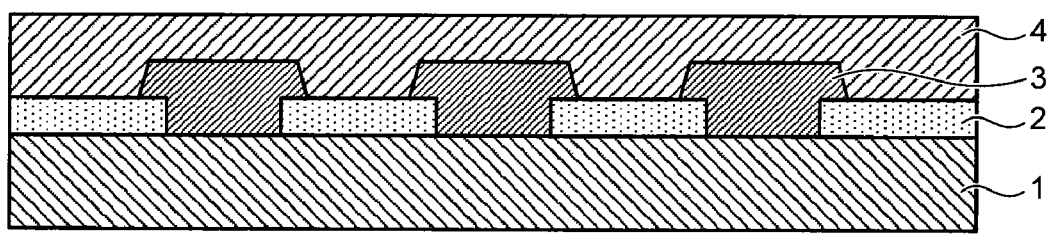
FIG. 1 is a schematic cross-sectional view for explaining a step of manufacturing a semiconductor device having a multilayer wiring structure according to an embodiment of the present invention.

| EXPLANATIONS OF LETTERS OR NUMERALS | |
| --- | --- |
| 1 | semiconductor substrate |
| 2 | protective film |
| 3 | first conductor layer |
| 4 | interlayer inslating-film layer |
| 5 | photosensitive resin layer |
| 6A, 6B, 6C | window |
| 7 | second conductor layer |
| 8 | surface-protecting film layer |

BEST MODE FOR CARRYING OUT THE INVENTION

Exemplary embodiments of a photosensitive resin composition, a method for manufacturing a patterned hardened film using the photosensitive resin composition, and an electronic part according to the present invention will be explained below in detail with reference to the accompanying drawings. The present invention is not limited to the following embodiments.

[Photosensitive Resin Composition]

Firstly, the photosensitive resin composition for low temperature hardening according to the present invention will be described. The photosensitive resin composition according to the present invention contains (a) a polybenzoxazole precursor having a repeating unit represented by the following general formula (I):

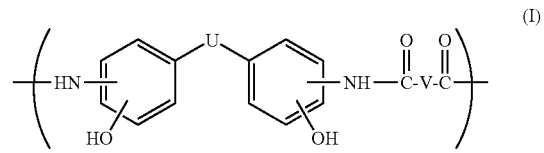

wherein U and V represents a divalent organic group, and at least one of U and V is a group containing an aliphatic chain structure having 1 to 30 carbon atoms, (b) a photosensitizer, (c) a solvent, and (d) a crosslinking agent capable of causing crosslinking or polymerization by heating. In the present specification, (a) a copolymer of a polybenzoxazole precursor, (b) a photosensitizer, (c) a solvent, and (d) a crosslinking agent capable of causing crosslinking or polymerization by heating may be simply referred to as "component (a)", "component (b)", "component (c)", and "component (d)", respectively.

Instead of the polybenzoxazole precursor having a repeating unit represented by the general formula (I), a polybenzoxazole precursor having a repeating unit represented by the following general formula (III) may be used as the component (a).

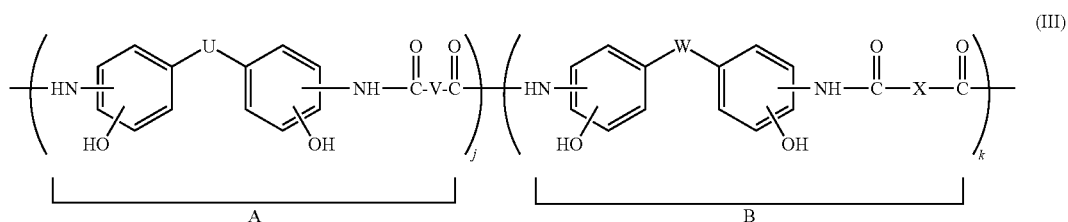

(III)

wherein U, V, W, and X each represent a divalent organic group, at least one of U and V is a group containing an aliphatic chain structure having 1 to 30 carbon atoms, j and k represent molar fractions of an A structure unit and a B structure unit, respectively, and the sum of j and k is 100 mol %.

Subsequently, the components of the photosensitive resin composition according to the present invention will be described.

(Component (a): Polybenzoxazole Precursor and Copolymer of Polybenzoxazole Precursor)

The photosensitive resin composition is generally developed using an alkaline aqueous solution, and therefore each of the polybenzoxazole precursor and the copolymer of polybenzoxazole precursor is preferably soluble in an alkaline aqueous solution. The composition of the present invention may contain, for example, a structure of a polyamide other than the aforementioned general formulae (I) and (III) which is not a polybenzoxazole precursor, a structure of a polybenzoxazole, or a structure of a polyimide or a polyimide precursor (for example, polyamidic acid or polyamidic acid ester), together with the structure of the polyoxazole precursor or copolymer of polybenzoxazole precursor of the aforementioned general formula (I) or (III).

The alkaline aqueous solution is an alkaline solution, such as an aqueous solution of tetramethylammonium hydroxide, an aqueous solution of a metal hydroxide, and an aqueous solution of an organic amine. The structure of the polyoxazole precursor or copolymer of polybenzoxazole precursor, i.e., the amide unit containing a hydroxyl group and being represented by the general formula (I) or (III) is eventually converted to an oxazole product having excellent heat resistance, mechanical properties, and electric properties by cyclodehydration during the hardening.

The polybenzoxazole precursor used in the present invention has a repeating unit represented by the aforementioned general formula (I) or (III), and the solubility of the polybenzoxazole precursor in an alkaline aqueous solution is attributed to an OH group (generally a phenolic hydroxyl group) bonded to U, and therefore the content of the amide unit containing the OH group is preferably at a certain amount or more.

For example, it is preferred that the polybenzoxazole precursor is a polyimide precursor represented by the following general formula (V) or (VI).

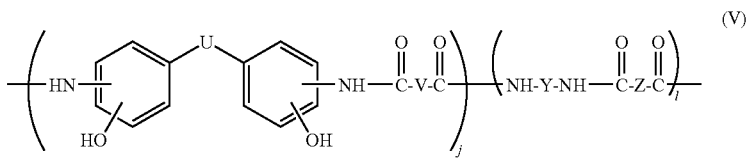

(V)

wherein each of U, V, Y, and Z represents a divalent organic group; j and l respectively represent molar fractions of the individual repeating units, the sum of j and l is 100 mol %, j is 60 to 100 mol %, and l is 40 to 0 mol %.

In the aforementioned formula (V), with respect to molar fractions j and l, it is more preferred that j=80 to 100 mol %, and l=20 to 0 mol %.

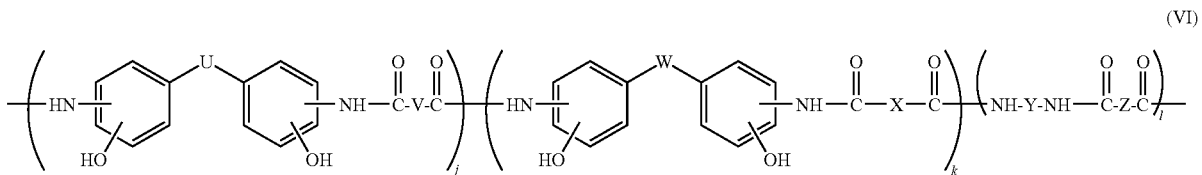

(VI)

wherein each of U, V, W, X, Y, and Z represents a divalent organic group; j, k, and l respectively represent molar fractions of the individual repeating units, the sum of j, k, and l is 100 mol %, the sum of j and k, i.e., j+k is 60 to 100 mol %, and l is 40 to 0 mol %.

In the aforementioned formula (VI), with respect to molar fractions j, k, and l, it is more preferred that j+k=80 to 100 mol %, and l=20 to 0 mol %.

The molecular weight of the component (a) is preferably 3,000 to 200,000, and more preferably 5,000 to 100,000, in terms of a weight average molecular weight. The molecular weight is a value as measured by a gel permeation chromatography method and converted in accordance with a calibration curve obtained from standard polystyrene.

In the present invention, with respect to the method for preparing a polybenzoxazole precursor or a copolymer of polybenzoxazole precursor, there is no particular limitation. For example, a polybenzoxazole precursor having a repeating unit represented by the aforementioned general formula (I) or (III) may be in general synthesized from a dicarboxylic acid derivative and a hydroxyl group-containing diamine. Specifically, the synthesis may be performed by a method in which a dicarboxylic acid derivative is converted to a dihalide derivative, followed by a reaction with the diamine. As the dihalide derivative, a dichloride derivative is preferred.

The dichloride derivative may be synthesized by reacting a dicarboxylic acid derivative with a halogenating agent. Examples of the halogenating agent for use may include thionyl chloride, phosphoryl chloride, phosphorus oxychloride, phosphorus pentachloride or the like, which are used in a general reaction for converting a carboxylic acid to an acid chloride.

With respect to the method for synthesizing the dichloride derivative, the dichloride derivative may be synthesized by reacting a dicarboxylic acid derivative and the aforementioned halogenating agent in a solvent, or reacting a dicarboxylic acid derivative with an excess amount of the halogenating agent and then distilling off the excess halogenating agent. As the reaction solvent, N-methyl-2-pyrrolidone, N-methyl-2-pyridone, N,N-dimethylacetamide, N,N-dimethylformamide, toluene, benzene or the like may be used.

When the aforementioned reaction is conducted in a solvent, the amount of the halogenating agent to be used relative to the dicarboxylic acid derivative is preferably 1.5 to 3.0 mol, and more preferably 1.7 to 2.5 mol, and when the reaction is conducted in the halogenating agent, the amount of the halogenating agent is preferably 4.0 to 50 mol, more preferably 5.0 to 20 mol. The reaction temperature is preferably −10 to 70° C., and more preferably 0 to 20° C.

The reaction of the dichloride derivative and the diamine is preferably conducted in an organic solvent in the presence of a dehydrohalogenating agent. Generally, as the dehydrohalogenating agent, an organic base such as pyridine or triethylamine is used. As the organic solvent, N-methyl-2-pyrrolidone, N-methyl-2-pyridone, N,N-dimethylacetamide, N,N-dimethylformamide or the like may be used. The reaction temperature is preferably −10 to 30° C., and more preferably 0 to 20° C.

The general formulae (I) and (III) are described below again, and subsequently the polybenzoxazole precursor having a repeating unit represented by the general formula (I) or (III) will be described in detail.

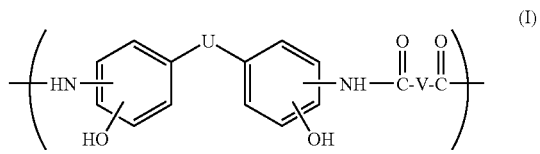

wherein U and V represents a divalent organic group, and at least one of U and V is a group containing an aliphatic chain structure having 1 to 30 carbon atoms.

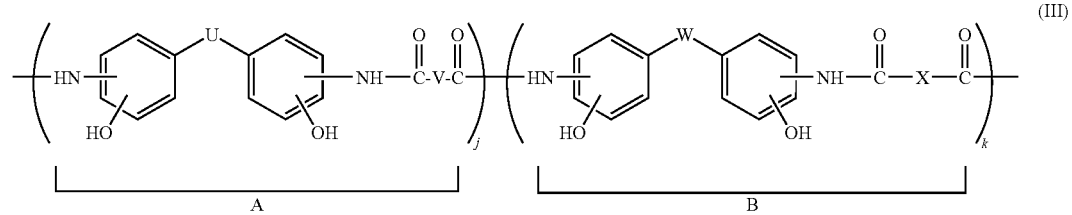

wherein each of U, V, W, and X represents a divalent organic group, at least one of U and V is a group containing an aliphatic chain structure having 1 to 30 carbon atoms, j and k represent molar fractions of the A structure unit and the B structure unit, respectively, and the sum of j and k is 100 mol %.

In the aforementioned formula (III), with respect to molar fractions j and k, it is more preferred that j=5 to 85 mol %, and k=15 to 95 mol %, from the viewpoint of pattern accuracy, mechanical properties, heat resistance, and resistance to chemicals.

Preferred examples of the group as U in the aforementioned general formulae (I) and (III) will be described.

The group containing an aliphatic chain structure having 1 to 30 carbon atoms may be present as either U or V in the general formulae (I) and (III). As the group containing an aliphatic chain structure, a group containing a structure represented by the following general formula (UV1) or (UV2) is preferred for achieving a high cyclodehydration rate at 280° C. or lower. A group having an aliphatic straight-chain structure having 7 to 30 carbon atoms is more preferred for achieving a low elastic modulus and a high breaking extension.

wherein each of $R^1$ and $R^2$ independently represents hydrogen, fluorine, or an alkyl group having 1 to 6 carbon atoms, and a' represents an integer of 1 to 30.

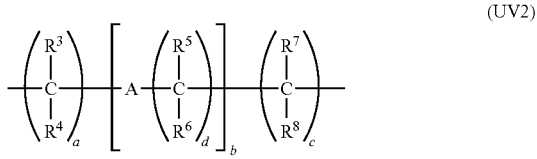
(UV2)

wherein each of $R^3$ to $R^8$ independently represents hydrogen, fluorine, or an alkyl group having 1 to 6 carbon atoms; each of a to c independently represents an integer of 1 to 6; d represents an integer of 0 to 3; and A represents —O—, —S—, —SO$_2$—, —CO—, —NHCO—, —C(CF$_3$)$_2$—, —C≡C—, or —R$^9$C=CR$^{10}$— (wherein each of $R^9$ and $R^{10}$ independently represents hydrogen, fluorine, or an alkyl group having 1 to 6 carbon atoms).

Examples of the diamines may include the following diamines.

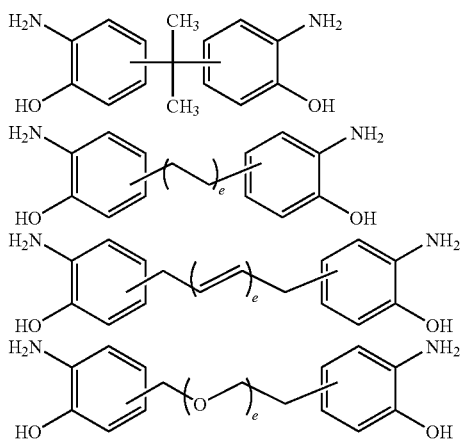

wherein e represents an integer of 1 to 6.

Examples of diamines used in U or W in the aforementioned general formulae (I) and (III) may include aromatic diamines other than those mentioned above, such as 3,3'-diamino-4,4'-dihydroxybiphenyl, 4,4'-diamino-3,3'-dihydroxybiphenyl, bis(3-amino-4-hydroxyphenyl) sulfone, bis(4-amino-3-hydroxyphenyl) sulfone, 2,2-bis(3-amino-4-hydroxyphenyl)-1,1,1,3,3,3-hexafluoropropane, and 2,2-bis(4-amino-3-hydroxyphenyl)-1,1,1,3,3,3-hexafluoropropane, although the diamines are not limited to these compounds. Each species of these diamines may be solely used or two or more species thereof may be used in combination.

When the diamine having an aliphatic chain structure is used, a diamine represented by the chemical formula (V) or the aforementioned general formula (VI) may be co-used in such an amount that the effects of the present invention are not degraded.

Subsequently, preferred groups as V in the aforementioned general formulae (I) and (III) will be described below.

In general, the divalent organic group represented by V in the general formulae (I) and (III) is a dicarboxylic acid residue which reacts with a diamine to form a polyamide structure.

In the present invention, a group containing an aliphatic chain structure having 1 to 30 carbon atoms may be present as either U or V in the general formulae (I) and (III). With respect to the group containing an aliphatic chain structure, the group preferably has a structure represented by the general formula (UV1) or (UV2) described below from the viewpoint of achieving high heat resistance, high transparency in the ultraviolet and visible light region, and high cyclodehydration rate at 280° C. or lower. It is more preferred that the group has an aliphatic straight-chain structure having 7 to 30 carbon atoms because the resultant polymer is easily soluble in not only N-methyl-2-pyrrolidone but also other solvents, such as γ-butyrolactone or propylene glycol monomethyl ether acetate, and exhibits high storage stability, low elastic modulus, and high breaking extension.

(UV1)

wherein each of $R^1$ and $R^2$ independently represents hydrogen, fluorine, or an alkyl group having 1 to 6 carbon atoms, and a' represents an integer of 1 to 30.

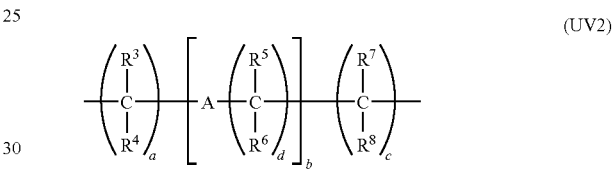
(UV2)

wherein each of $R^3$ to $R^8$ independently represents hydrogen, fluorine, or an alkyl group having 1 to 6 carbon atoms; each of a to c independently represents an integer of 1 to 6; d represents an integer of 0 to 3; and A represents —O—, —S—, —SO$_2$—, —CO—, —NHCO—, —C(CF$_3$)$_2$—, —C≡C—, or —R$^9$C=CR$^{10}$— (wherein each of $R^9$ and $R^{10}$ independently represents hydrogen, fluorine, or an alkyl group having 1 to 6 carbon atoms).

Examples of the dicarboxylic acids may include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and dicarboxylic acids represented by the following general formulae:

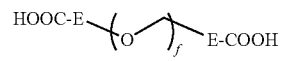

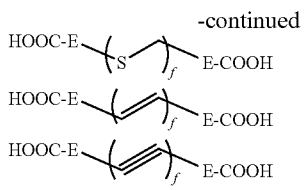

wherein E represents a hydrocarbon group having 1 to 6 carbon atoms, and f represents an integer of 1 to 6.

Other examples of the dicarboxylic acid for use as V, X, or Z in the general formulae (I), (III), (V), and (VI) may include an aromatic dicarboxylic acid, such as isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenyl ether, 4,4'-dicarboxytetraphenylsilane, bis(4-carboxyphenyl) sulfone, 2,2-bis(p-carboxyphenyl) propane, 5-tert-butylisophthalic acid, 5-bromoisophthalic acid, 5-fluoroisophthalic acid, 5-chloroisophthalic acid, and 2,6-naphthalenedicarboxylic acid. Each species of these compounds may be solely used or two or more species thereof may be used in combination.

When the polybenzoxazole precursor is represented by the aforementioned general formula (V) or (VI), the divalent organic group represented by Y is a residue derived from a diamine (other than the dihydroxydiamine forming U), which residue generally reacts with a dicarboxylic acid to form a polyamide structure. With respect to Y, it is preferable to use a divalent aromatic group or aliphatic group, preferably having 4 to 40 carbon atoms, and it is more preferable to use a divalent aromatic group having 4 to 40 carbon atoms.

Examples of such diamines may include aromatic diamine compounds, such as 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl) sulfone, bis(3-aminophenoxyphenyl) sulfone, bis(4-aminophenoxy)biphenyl, bis[4-(4-aminophenoxy)phenyl]ether, and 1,4-bis(4-aminophenoxy)benzene, and diamines containing a silicone group, such as commercially available products, e.g., product names "LP-7100", "X-22-161AS", "X-22-161A", "X-22-161B", "X-22-161C", and "X-22-161E" (each by Shin-Etsu Chemical Co., Ltd.), although the diamine is not limited to these compounds. Each species of these compounds may be solely used or two or more species thereof may be used in combination.

(Component (b): Photosensitizer)

The photosensitive resin composition according to the present invention contains (b) a photosensitizer, together with the polybenzoxazole precursor. The photosensitizer is sensitive to light and imparts a function to the film formed from the composition, so that the film interacts with a developer liquid. With respect to the photosensitizer used as the component (b) in the present invention, while there is no particular limitation, a photosensitizer that generates acid or radicals by irradiation with light is preferred.

In the case of the positive photosensitive resin composition, it is more preferred that photosensitizer (b) is a photosensitizer that generates acid by irradiation with light (photoacid generator). In the positive photosensitive resin composition, the photoacid generator generates acid by irradiation with light to increase the solubility of the light irradiated portion in an alkaline aqueous solution. Examples of such photoacid generators may include o-quinonediazide compounds, aryldiazonium salts, diaryliodonium salts, and triarylsulfonium salts. Preferred examples thereof may be o-quinonediazide compounds having high sensitivity.

The o-quinonediazide compound is obtained by, for example, condensation reaction of an o-quinonediazidosulfonyl chloride with a hydroxy compound, an amino compound or the like in the presence of a dehydrochlorinating agent. As the o-quinonediazidosulfonyl chlorides, benzoquinone-1,2-diazido-4-sulfonyl chloride, naphthoquinone-1,2-diazido-5-sulfonyl chloride, naphthoquinone-1,2-diazido-4-sulfonyl chloride or the like may be used.

As the hydroxy compound, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane or the like may be used.

As the amino compound, p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl) hexafluoropropane, bis(4-amino-3-hydroxyphenyl) hexafluoropropane or the like may be used.

The o-quinonediazidosulfonyl chloride and at least one of the hydroxy compound and the amino compound are preferably incorporated so that the sum of the hydroxyl group and amino group is 0.5 to 1 equivalent, relative to 1 mol of the o-quinonediazidosulfonyl chloride. A preferred ratio of the dehydrochlorinating agent and the o-quinonediazidosulfonyl chloride is in the range of 0.95/1 to 1/0.95. A preferred reaction temperature is 0 to 40° C., and a preferred reaction time is 1 to 10 hours.

As the reaction solvent for the aforementioned reaction, solvents such as dioxane, acetone, methyl ethyl ketone, tetrahydrofuran, diethyl ether, and N-methylpyrrolidone may be used. Examples of dehydrochlorinating agents may include sodium carbonate, sodium hydroxide, sodium hydrogencarbonate, potassium carbonate, potassium hydroxide, trimethylamine, triethylamine, and pyridine.

When the structure represented by U, V, X, or Y in the general formulae (I) and (V) has a photo-crosslinkable group such as an acryloyl group or a methacryloyl group, employment of a photosensitizer that generates radicals such as a photopolymerization initiator as the component (b) (photosensitizer) may give a composition which can be used as a negative type photosensitive resin composition. The negative type photosensitive resin composition undergoes a crosslinking reaction caused by irradiation with light by which the solubility of the light irradiated portion in an alkaline aqueous solution is reduced.

In the photosensitive resin composition according to the present invention, from the viewpoint of the difference in dissolution speed between the light-exposed portion and the unexposed portion and acceptable variation of the sensitivity, the amount of the component (b) (photosensitizer) to be incorporated is preferably 5 to 100 parts by weight, and more preferably 8 to 40 parts by weight, relative to 100 parts by weight of the component (a) (base resin).

(Component (c): Solvent)

With respect to the component (c) (solvent) used in the present invention, examples therefor may include γ-butyrolactone, ethyl lactate, propylene glycol monomethyl ether acetate, benzyl acetate, n-butyl acetate, ethoxyethyl propionate, 3-methyl methoxypropionate, N-methyl-2-pyrrolidone, N,N-dimethylformamide, N,N-dimethylacetamide, dimethyl sulfoxide, hexamethylphosphorylamide, tetramethylene sulfone, cyclohexanone, cyclopentanone, diethyl ketone, diisobutyl ketone, and methyl amyl ketone.

Each species of these solvents may be solely used or two or more species thereof may be used in combination. With respect to the amount of the solvent used, while there is no particular limitation, it is generally preferred that the amount of the solvent in the composition is adjusted to 20 to 90% by weight.

(Component (d): Crosslinking Agent Capable of Causing Crosslinking or Polymerization by Heating)

The crosslinking agent capable of causing crosslinking or polymerization by heating used as the component (d) in the present invention is a compound that reacts, namely, crosslinks with a polybenzoxazole precursor or polybenzoxazole in the photosensitive resin composition at the heating treatment step that is performed after application, light-exposure and development. Alternatively, at the heating treatment step, the compound itself undergoes polymerization. By the crosslinking agent, brittleness of the film that is concerned during hardening at a relatively low temperature, for example, at 200° C. or lower can be prevented, which improves mechanical properties, resistance to chemicals, and flux resistance.

While there is no particular limitation as long as it is a compound capable of causing crosslinking or polymerization at the heating treatment step, the component (d) may preferably be a compound having in the molecule thereof a methylol group, an alkoxymethyl group, an epoxy group, or a vinyl ether group. The compound may preferably be a compound having the aforementioned group bonded to a benzene ring, or may be a melamine resin or urea resin substituted with at least one of a methylol group and an alkoxymethyl group at the N-position. A compound having the aforementioned group bonded to a benzene ring having a phenolic hydroxyl group is more preferred because the compound can increase the dissolution speed of the light-exposed portion during the development, to thereby improve the sensitivity. Particularly, more preferred is a compound having two or more methylol groups or alkoxymethyl groups in the molecule thereof, in terms of the sensitivity and the stability of a varnish and prevention of melting of the patterned film upon hardening.

Such compounds may be represented by the following general formulae (VII) to (VIV).

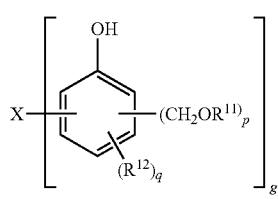
(VII)

wherein X represents a single bond or a mono- to tetra-valent organic group, each of $R^{11}$ and $R^{12}$ independently represents a hydrogen atom or a monovalent organic group, g represents an integer of 1 to 4, and each of p and q independently represents an integer of 0 to 4.

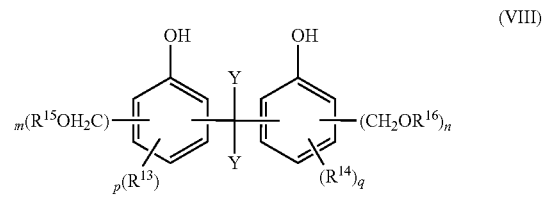
(VIII)

wherein two Y's each independently represent a hydrogen atom or an alkyl group having 1 to 10 carbon atoms and optionally contains an oxygen atom or a fluorine atom, each of $R^{13}$ to $R^{16}$ independently represents a hydrogen atom or a monovalent organic group, each of m and n independently represents an integer of 1 to 3, and each of p and q independently represents an integer of 0 to 4.

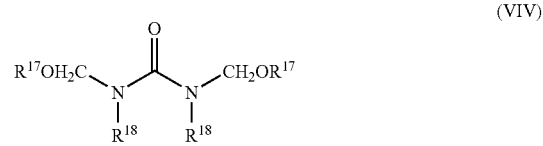
(VIV)

wherein each of $R^{17}$ and $R^{18}$ independently represents a hydrogen atom or a monovalent organic group, and a plurality of $R^{18}$'s may be connected to each other to form a cyclic structure.

Examples of the crosslinking agents may include the following compounds:

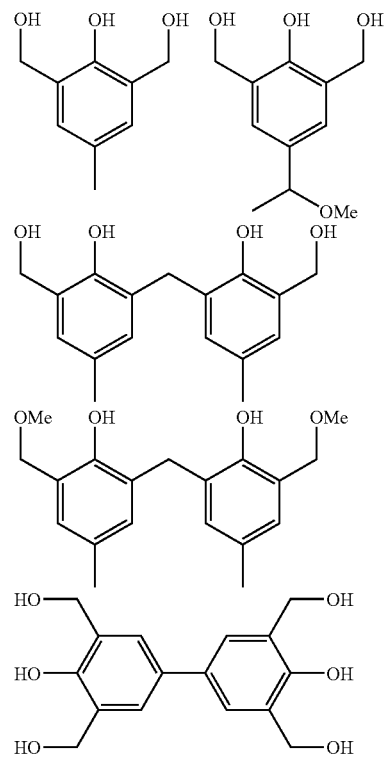

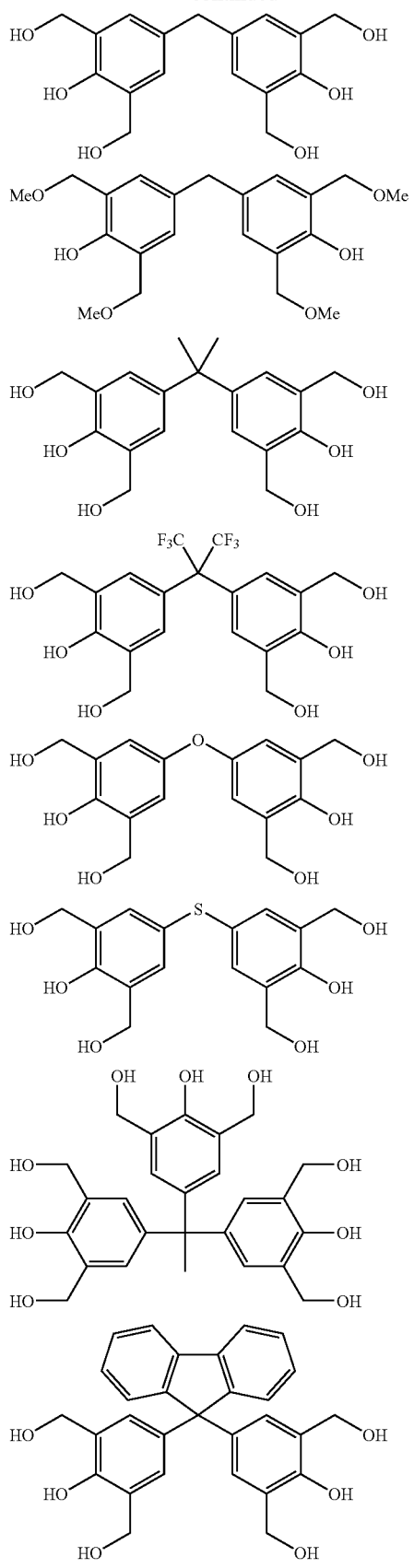
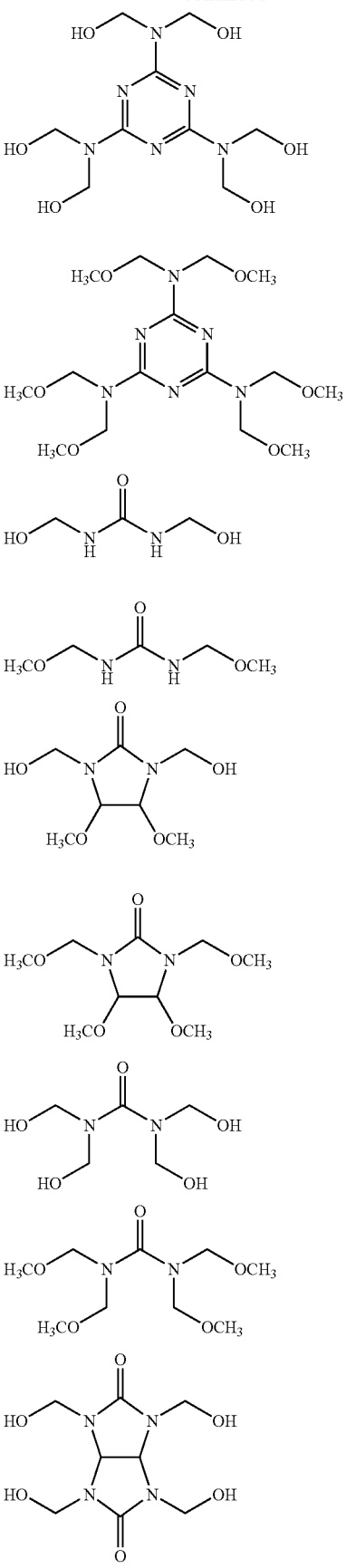

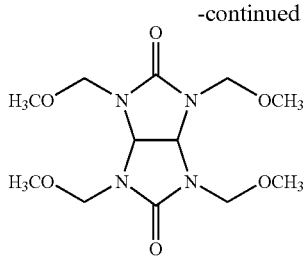

However, the crosslinking agent is not limited to these compounds. Each species of these compounds may be solely used or two or more species thereof may be used in combination.

In the photosensitive resin composition according to the present invention, from the viewpoint of the development time, acceptable variation of the film-remaining ratio on the light-unexposed portion, and properties of the hardened film, the amount of the component (d) (crosslinking agent capable of causing crosslinking or polymerization by heating) to be incorporated is preferably 1 to 50 parts by weight, relative to 100 parts by weight of the component (a) (base resin). On the other hand, from the viewpoint of resistance to chemicals and flux resistance of the film hardened at 230° C. or lower, the amount of the component (d) to be incorporated is preferably equal to or more than 15 parts by weight, and more preferably equal to or more than 20 parts by weight.

(Component (e): Thermal Acid Generator)

In the present invention, further, as a component (e), a thermal acid generator (thermal latent-acid generator) may be used. It is preferable to use the thermal acid generator, because it efficiently serves as a catalyst in a reaction in which the phenolic hydroxyl group-containing polyamide structure in the polybenzoxazole precursor undergoes a dehydration reaction to cause cyclization. In addition, when the specific resin exhibiting high cyclodehydration rate at about 280° C. or lower and the thermal acid generator are used in combination in the present invention, the cyclodehydration reaction proceeds at a lower temperature, so that a film of the resin composition hardened at a lower temperature acquires properties comparable to those of a film hardened at a high temperature.

As the acid generated from the thermal acid generator (thermal latent-acid generator), strong acid is preferred. Specifically, preferred examples of strong acids may include arylsulfonic acids such as p-toluenesulfonic acid and benzenesulfonic acid; perfluoroalkylsulfonic acids such as camphorsulfonic acid, trifluoromethanesulfonic acid, and nonafluorobutanesulfonic acid; and alkylsulfonic acids such as methanesulfonic acid, ethanesulfonic acid, and butanesulfonic acid. These acids efficiently serve as a catalyst in a reaction in which the phenolic hydroxyl group-containing polyamide structure in the polybenzoxazole precursor undergoes a dehydration reaction to cause cyclization. On the other hand, with respect to an acid generator that generates hydrochloric acid, bromic acid, iodic acid, nitric acid or the like, the acid generated from the acid generator has low acidity and further easily volatilizes due to heating, and therefore such an acid generator is considered to have almost no effect on the cyclodehydration reaction of the polybenzoxazole precursor, making it difficult to achieve sufficient effects of the present invention.

The aforementioned acid is added to the photosensitive resin composition according to the present invention as a thermal acid generator in the form of a salt, such as an onium salt, or in the form of a covalent bond, such as imide sulfonate.

Preferred examples of the onium salts may include diaryliodonium salts such as a diphenyliodonium salt; di(alkylaryl)iodonium salts such as a di(t-butylphenyl)iodonium salt; trialkylsulfonium salts such as a trimethylsulfonium salt; dialkylmonoarylsulfonium salts such as a dimethylphenylsulfonium salt; and diarylmonoalkyliodonium salts such as a diphenylmethylsulfonium salt. It is preferable to use these onium salts, because they have a decomposition start temperature in the range of 150 to 250° C. and efficiently decompose in the cyclodehydration reaction of the polybenzoxazole precursor at 280° C. or lower. On the other hand, a triphenylsulfonium salt is not desirable as the thermal acid generator in the present invention. The reason for this is that, presumably, the triphenylsulfonium salt has high heat stability, generally has a decomposition temperature of higher than 300° C., and hence does not decompose in the cyclodehydration reaction of the polybenzoxazole precursor at 280° C. or lower, so that it does not satisfactorily serve as a catalyst for the cyclodehydration.

From the aforementioned points, as well as the viewpoint of storage stability and developing properties, the onium salt as a thermal acid generator may be a diaryliodonium salt, di(alkylaryl)iodonium salt, trialkylsulfonium salt, dialkylmonoarylsulfonium salt, or diarylmonoalkyliodonium salt of an arylsulfonic acid, camphorsulfonic acid, perfluoroalkylsulfonic acid, or alkylsulfonic acid. More specifically, preferred examples may include di(t-butylphenyl)iodonium salt of paratoluenesulfonic acid (1% weight loss temperature: 180° C.; 5% weight loss temperature: 185° C.), di(t-butylphenyl)iodonium salt of trifluoromethanesulfonic acid (1% weight loss temperature: 151° C.; 5% weight loss temperature: 173° C.), trimethylsulfonium salt of trifluoromethanesulfonic acid (1% weight loss temperature: 255° C.; 5% weight loss temperature: 278° C.), dimethylphenylsulfonium salt of trifluoromethanesulfonic acid (1% weight loss temperature: 186° C.; 5% weight loss temperature: 214° C.), diphenylmethylsulfonium salt of trifluoromethanesulfonic acid (1% weight loss temperature: 154° C.; 5% weight loss temperature: 179° C.), di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid, and diphenylmethylsulfonium salt of toluenesulfonic acid.

As the imide sulfonate, naphthoylimide sulfonate is desired. On the other hand, phthalimide sulfonate is not desirable because it has such poor heat stability that it generates acid before the hardening reaction, leading to the deterioration of storage stability or the like.

Specific preferred examples of naphthoylimide sulfonates may include 1,8-naphthoylimidotrifluoromethyl sulfonate (1% weight loss temperature: 189° C.; 5% weight loss temperature: 227° C.) and 2,3-naphthoylimidotrifluoromethyl sulfonate (1% weight loss temperature: 185° C.; 5% weight loss temperature: 216° C.).

As the component (e) (thermal acid generator), a compound having a $R^{19}R^{20}C=N-O-SO_2-R$ structure such as the one represented by the chemical formula (X) described below (1% weight loss temperature: 204° C.; 5% weight loss temperature: 235° C.) may also be used. Examples of R may include aryl groups such as a p-methylphenyl group and a phenyl group; alkyl groups such as a methyl group, an ethyl group, and an isopropyl group; and perfluoroalkyl groups such as a trifluoromethyl group and a nonafluorobutyl group. Examples of $R^{19}$ may include a cyano group, and examples of $R^{20}$ may include a methoxyphenyl group and a phenyl group.

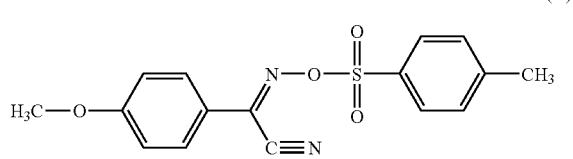

(X)

As the component (e) (thermal acid generator), a compound having an amide structure —HN—SO$_2$—R' such as the one represented by the chemical formula (XI) described below (1% weight loss temperature: 104° C.; 5% weight loss temperature: 270° C.) may also be used. Examples of R' may include alkyl groups such as a methyl group, an ethyl group, and a propyl group; aryl groups such as a methylphenyl group and a phenyl group; and perfluoroalkyl group such as a trifluoromethyl group and nonafluorobutyl group. Examples of groups to which the amide structure —HN—SO$_2$—R' is bonded may include 2,2,-bis(4-hydroxyphenyl)hexafluoropropane, 2,2,-bis(4-hydroxyphenyl)propane, and di(4-hydroxyphenyl)ether.

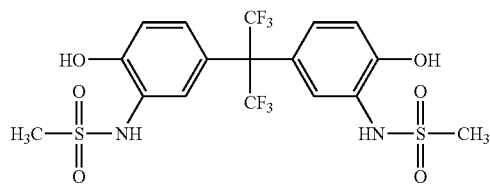

(XI)

As the component (e) (thermal acid generator) used in the present invention, a salt formed from a strong acid and a base other than the onium salts may also be used. Preferred examples of the strong acids may include arylsulfonic acids such as p-toluenesulfonic acid and benzenesulfonic acid; perfluoroalkylsulfonic acids such as camphorsulfonic acid, trifluoromethanesulfonic acid, and nonafluorobutanesulfonic acid; and alkylsulfonic acids such as methanesulfonic acid, ethanesulfonic acid, and butanesulfonic acid. Preferred examples of the bases may include pyridine; alkylpyridines such as 2,4,6-trimethylpyridine; N-alkylpyridines such as 2-chloro-N-methylpyridine; and halogenated N-alkylpyridines. More specifically, from the viewpoint of storage stability and developing properties, preferred examples may include pyridine salt of p-toluenesulfonic acid (1% weight loss temperature: 147° C.; 5% weight loss temperature: 190° C.) dibenzyl L-aspartate salt of p-toluenesulfonic acid (1% weight loss temperature: 202° C.; 5% weight loss temperature: 218° C.), 2,4,6-trimethylpyridine salt of p-toluenesulfonic acid, and 1,4-dimethylpyridine salt of p-toluenesulfonic acid. These compounds can decompose in the cyclodehydration reaction of the polybenzoxazole precursor at 280° C. or lower and serve as a catalyst.

The amount of the component (e) (thermal acid generator) incorporated is preferably 0.1 to 30 parts by weight, more preferably 0.2 to 20 parts by weight, and further preferably 0.5 to 10 parts by weight, relative to 100 parts by weight of the component (a) (base resin).

[Optional Components]

In addition to the components (a) to (d) mentioned above, the photosensitive resin composition according to the present invention may contain an optional components, such as (1) a dissolution accelerator, (2) a dissolution inhibitor, (3) an adhesion improving agent, and (4) a surfactant or a leveling agent.

((1) Dissolution Accelerator)

In the present invention, a dissolution accelerator that accelerates dissolution of the base resin, i.e. the component (a), in an alkaline aqueous solution, may be further incorporated. An example thereof may be a compound having a phenolic hydroxyl group. When a compound having a phenolic hydroxyl group is added, the dissolution speed of the light-exposed portion during the development using an alkaline aqueous solution may be accelerated to thereby improve the sensitivity, and the patterned film can be prevented from melting upon hardening.

Although there is no particular limitation to the compound having a phenolic hydroxyl group usable in the present invention, examples of low-molecular compounds having a phenolic hydroxyl group may include o-cresol, m-cresol, p-cresol, 2,4-xylenol, 2,5-xylenol, 2,6-xylenol, bisphenol A, B, C, E, F, and G, 4,4',4"-methylidynetrisphenol, 2,6-[(2-hydroxy-5-methylphenyl)methyl]-4-methylphenol, 4,4'-(1-{4-[1-(4-hydroxyphenyl)-1-methylethyl]phenyl}ethylidene) bisphenol, 4,4'-(1-{4-[2-(4-hydroxyphenyl)-2-propyl] phenyl}ethylidene)bisphenol, 4,4',4"-ethylidynetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis[3,5-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4"-(3-methyl-1-propanyl-3-ylidyne)trisphenol, 4,4',",4'"-(1,4-phenylenedimethylidyne)tetrakisphenol, 2,4,6-tris[(3,5-dimethyl-4-hydroxyphenyl)methyl]-1,3-benzenediol, 2,4,6-tris[(3,5-dimethyl-2-hydroxyphenyl)methyl]-1,3-benzenediol, and 4,4'-[1-(4-{1-(4-hydroxyphenyl)-3,5-bis [(hydroxy-3-methylphenyl)methyl]phenyl}-phenyl) ethylidene]bis[2,6-bis(hydroxy-3-methylphenyl)methyl] phenol.

From the viewpoint of the development time and acceptable variation of the film-remaining ratio on the light-unexposed portion, the amount of the compound having a phenolic hydroxyl group to be incorporated is preferably 1 to 30 parts by weight, and more preferably 3 to 25 parts by weight, relative to 100 parts by weight of the component (a) (base resin).

((2) Dissolution Inhibitor)

In the present invention, a dissolution inhibitor, which is a compound that inhibits dissolution of the base resin, i.e. the component (a), in an alkaline aqueous solution, may be further incorporated. Specific examples thereof may include diphenyliodonium nitrate, bis(p-tert-butylphenyl)iodonium nitrate, diphenyliodonium bromide, diphenyliodonium chloride, and diphenyliodonium iodide.

Acid generated from the aforementioned compound easily volatilizes, and hence the compound does no involvement in the cyclodehydration reaction of the polybenzoxazole precursor. However, the compound effectively inhibits the dissolution of the base resin and is useful to control the remaining film thickness or development time. From the viewpoint of acceptable variation of the sensitivity and development time, the amount of this component (dissolution inhibitor) to be incorporated is preferably 0.01 to 50 parts by weight, more preferably 0.01 to 30 parts by weight, and further preferably 0.1 to 20 parts by weight, relative to 100 parts by weight of the component (a) (base resin).

((3) Adhesion Improving Agent)

For improving the adhesion of the hardened film to a substrate, the photosensitive resin composition according to the present invention may contain an adhesion improving agent, such as an organosilane compound or an aluminum chelate compound.

Examples of organosilane compounds may include vinyltriethoxysilane, γ-glycidoxypropyltriethoxysilane, γ-methacryloyloxypropyltrimethoxysilane, ureidopropyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene. Examples of aluminum chelate compounds may include tris(acetylacetonato)aluminum and acetylacetate aluminum diisopropylate.

When the adhesion improving agent is used, the amount of the adhesion improving agent used is preferably 0.1 to 30 parts by weight, and more preferably 0.5 to 20 parts by weight, relative to 100 parts by weight of the component (a) (base resin).

((4) Surfactant or Leveling Agent)

In the photosensitive resin composition according to the present invention, for improving coating properties such as preventing striation (uneven thickness), and for improving the developing properties, an appropriate surfactant or leveling agent may be added.

Examples of such surfactants or leveling agents may include polyoxyethylene lauryl ether, polyoxyethylene stearyl ether, polyoxyethylene oleyl ether, and polyoxyethylene octyl phenol ether, as well as commercially available products such as product names "MEGAFACS F171", "F173", "R-08" (each by Dainippon Ink & Chemicals Incorporated), product names "Fluorad FC430", "FC431" (each by Sumitomo 3M Limited), and product names "Organosiloxane polymer KP341", "KBM303", "KBM403", "KBM803" (each by Shin-Etsu Chemical Co., Ltd.).

[Method for Manufacturing Patterned Hardened Film]

Subsequently, the method for manufacturing a patterned hardened film according to the present invention will described below. The method for manufacturing a patterned hardened film according to the present invention comprises a photosensitive-resin-film forming step of applying the aforementioned photosensitive resin composition to a substrate and drying the resin composition to form a photosensitive resin film, a light-exposure step of subjecting the photosensitive resin film to light exposure with a predetermined pattern, a development step of developing the photosensitive resin film after the light exposure to obtain a patterned resin film, and a heating treatment step of subjecting the patterned resin film to heating treatment to obtain a patterned hardened film, whereby a patterned hardened film of polybenzoxazole can be produced.

Each step will be described below.

(Photosensitive-Resin-Film Forming Step)

At this step, firstly the photosensitive resin composition according to the present invention is applied to a substrate formed of, for example, a glass substrate, a semiconductor, a metal oxide insulator (such as $TiO_2$ or $SiO_2$), and silicon nitride by spin coating using a spinner or the like, and then dried using a hot plate or an oven. Thereby a photosensitive resin film that is a film of the photosensitive resin composition may be obtained.

(Light-Exposure Step)

At the subsequent light-exposure step, the photosensitive resin film formed as a coating film on the substrate is subjected to light-exposure through a mask by irradiation with active rays of light, such as ultraviolet light, visible light, or radiation.

(Development Step)

At the development step, the portion of the photosensitive resin film exposed to the active rays of light is removed by a developer liquid to obtain a patterned hardened film. Preferred examples of developer liquids may include alkaline aqueous solutions of, e.g., sodium hydroxide, potassium hydroxide, sodium silicate, ammonia, ethylamine, diethylamine, triethylamine, triethanolamine, and tetramethylammonium hydroxide. The aqueous solution preferably has a base concentration of 0.1 to 10% by weight. An alcohol or a surfactant may be added to the developer liquid, each of which may be added in an amount in the range of preferably 0.01 to 10 parts by weight, and more preferably 0.1 to 5 parts by weight, relative to 100 parts by weight of the developer liquid.

(Heating Treatment Step)

At the heating treatment step, the pattern obtained after the development is subjected to heating treatment to form a pattern made of heat-resistant polyoxazole having an oxazole ring or another functional group. At the heating treatment step, the heating temperature may be equal to or less than 280° C., desirably 120 to 280° C., more desirably 160 to 250° C.

The heating treatment is performed using a quartz tube oven, a hot plate, a rapid thermal anneal, a vertical diffusion oven, an infrared curing oven, an electron-beam curing oven, a microwave curing oven or the like. The atmosphere for heating treatment may be selected from an atmosphere of air and an atmosphere of inert gas such as nitrogen gas. The nitrogen gas atmosphere is desirable because thereby the photosensitive resin composition film can be prevented from oxidation. The aforementioned range of heating temperature is lower than the heating temperature conventionally employed, and therefore damages to the substrate or device can be suppressed. Therefore, by using a method for manufacturing a pattern according to the present invention, a device can be produced in high yield. Further, the energy for the process can be saved.

In the heating treatment in the present invention, as an alternative to the use of a general oven filled with nitrogen gas, a microwave curing apparatus or variable-frequency microwave curing apparatus may also be used. By using such an apparatus, while maintaining the temperature of the substrate or device at, for example, 220° C. or lower, only the photosensitive resin composition film can be effectively heated.

For example, in Japanese Patent No. 2587148 and Japanese Patent No. 3031434, cyclodehydration of a polyimide precursor using a microwave is examined. Further, U.S. Pat. No. 5,738,915 proposes a method for cyclodehydration of a polyimide precursor thin film using a microwave, in which the polyimide thin film is irradiated with a microwave while changing the frequency of the microwave in a short period of time to suppress damages to the polyimide thin film or substrate.

When irradiation is performed with a microwave in a pulse form while changing the frequency of the microwave, standing waves can be prevented, and thus it is preferable because uniform heating on the surface of the substrate can be performed. When a substrate having a metal wiring, such as an electronic part, is irradiated with a microwave in a pulse form while changing the frequency of the microwave, for example, the occurrence of electronic discharge from the metal can be suppressed, whereby the electronic part can be advantageously prevented from breaking.

The frequency of the microwave used for cyclodehydration of the polybenzoxazole precursor contained in the photosensitive resin composition according to the present invention may be in the range of 0.5 to 20 GHz, practically, preferably in the range of 1 to 10 GHz, and more preferably in the range of 2 to 9 GHz.

It is desired that the frequency of the microwave is continuously changed. However, in practice, the frequency of the microwave may be changed in a stepwise manner. In this case, the time during which the photosensitive resin composition is irradiated with a microwave having a single frequency is preferably as short as possible in order to avoid occurrence of standing waves and electronic discharge from a metal or the like, and the time is preferably equal to or less than 1 millisecond, particularly preferably equal to or less than 100 microseconds.

The output power of the microwave may vary depending on the size of the apparatus or the amount of the material to be heated. However, the output power is generally in the range of 10 to 2,000 Watts, practically, more preferably 100 to 1,000 Watts, further preferably 100 to 700 Watts, and the most preferably 100 to 500 Watts. When the output power is equal to or less than 10 Watts, it may be difficult to heat the material in a short time. On the other hand, when the output power is equal to or more than 2,000 Watts, it is not preferable because a rapid temperature elevation is likely to occur.

As mentioned above, the temperature for cyclodehydration of the polybenzoxazole precursor contained in the photosensitive resin composition according to the present invention by irradiation with a microwave is preferably at a low temperature in order to suppress damages to the polybenzoxazole thin film which has been obtained after the cyclodehydration or substrate. In the present invention, the temperature for cyclodehydration is preferably 280° C. or lower, further preferably 250° C. or lower, more preferably 230° C. or lower, and the most preferably 220° C. or lower. The temperature of the substrate may be measured by a known method using infrared ray or a thermocouple such as GaAs.

It is preferred that the microwave used for cyclodehydration of the polybenzoxazole precursor contained in the photosensitive resin composition according to the present invention is turned on or off in a pulse form. When the photosensitive resin composition is irradiated with a microwave in a pulse form, the predetermined heating temperature can be maintained, and damages to the polybenzoxazole thin film and substrate can be advantageously suppressed. While the time of a unit of continuous irradiation of a microwave in a pulse form may vary depending on the conditions, the time is generally equal to or less than 10 seconds.

The time for cyclodehydration of the polybenzoxazole precursor contained in the photosensitive resin composition according to the present invention is a period of time during which the cyclodehydration reaction proceeds satisfactorily, and from the viewpoint of achieving high operating efficiency, the time for the cyclodehydration is generally 5 hours or less. The atmosphere for the cyclodehydration may be selected from an atmosphere of air and an atmosphere of inert gas such as nitrogen gas.

As described above, when a substrate having thereon the photosensitive resin composition according to the present invention as a layer is irradiated with a microwave under the aforementioned conditions to cause cyclodehydration of the polybenzoxazole precursor contained in the photosensitive resin composition according to the present invention, polyoxazole having properties comparable to those of a film obtained by cyclodehydration at a high temperature using a thermal diffusion oven can be obtained even a cyclodehydration process is performed at a lower temperature using a microwave.

[Process for Manufacturing Semiconductor Device]

As an example of the method for manufacturing a pattern according to the present invention, a process for manufacturing a semiconductor device will be described below with reference to the accompanying drawings. FIG. 1 to FIG. 5 are schematic cross-sectional views for explaining a process for manufacturing a semiconductor device having a multilayer wiring structure, depicting a series of steps from the first to the fifth steps.

In these drawings, a semiconductor substrate 1, such as a Si substrate, having a circuit element (not shown) is covered with a protective film 2, such as a silicon oxide film, excluding a predetermined portion for the circuit element, and has a first conductor layer 3 formed on the exposed circuit element. A film of a polyimide resin or the like is formed as an interlayer inslating-film layer 4 on the semiconductor substrate by a spin coating method or the like (first step; FIG. 1).

Figure 2:
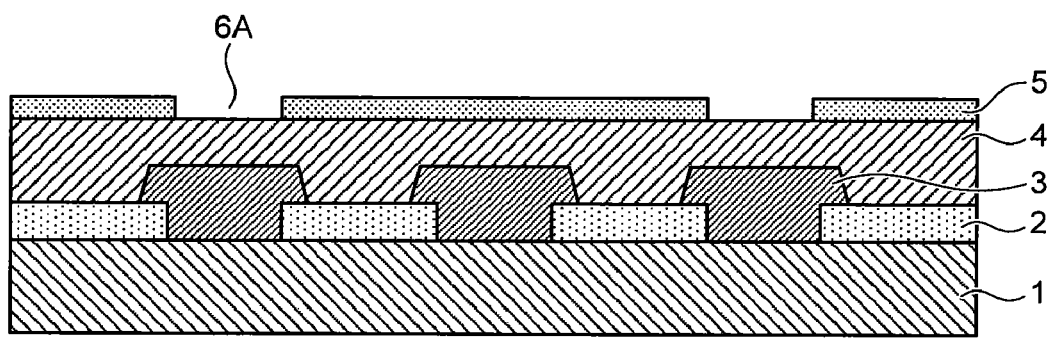
FIG. 2 is a schematic cross-sectional view for explaining a step of manufacturing the semiconductor device having the multilayer wiring structure according to the embodiment of the present invention.
Figure 3:
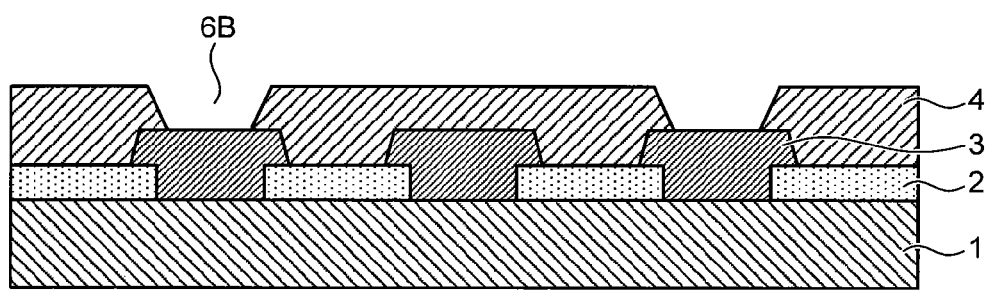
FIG. 3 is a schematic cross-sectional view for explaining a step of manufacturing the semiconductor device having the multilayer wiring structure according to the embodiment of the present invention.

A photosensitive resin layer 5 of, for example, a chlorinated rubber or phenolic novolak is then formed as a mask on the interlayer inslating-film layer 4 by a spin coating method, and windows 6A are formed in the photosensitive resin layer by a known photolithography technique so that predetermined portions of the interlayer inslating-film layer 4 are exposed (second step; FIG. 2). The interlayer inslating-film layer 4 in a region of the windows 6A is selectively etched by a dry etching method using gas of, for example, oxygen or carbon tetrafluoride to form windows 6B. The photosensitive resin layer 5 is then completely removed using an etching solution that etches only the photosensitive resin layer 5 without etching the first conductor layer 3 exposed through the windows 6B (third step; FIG. 3).

Figure 4:
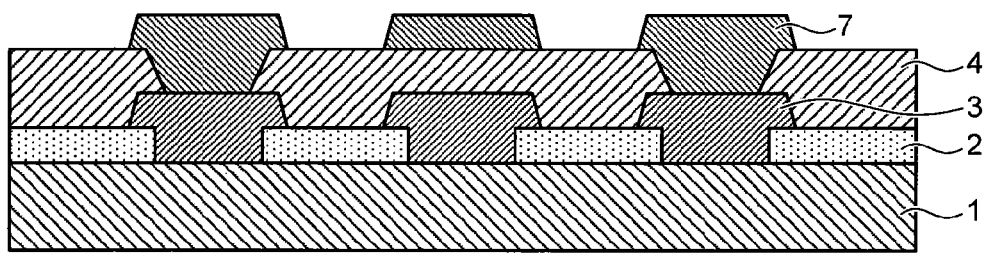
FIG. 4 is a schematic cross-sectional view for explaining a step of manufacturing the semiconductor device having the multilayer wiring structure according to the embodiment of the present invention.

Further, a second conductor layer 7 is formed using a known photolithography technique to complete an electrical connection with the first conductor layer 3 (fourth step; FIG. 4). When a multilayer wiring structure of three or more layers is formed, the aforementioned steps are repeated to form individual layers.

Figure 5:
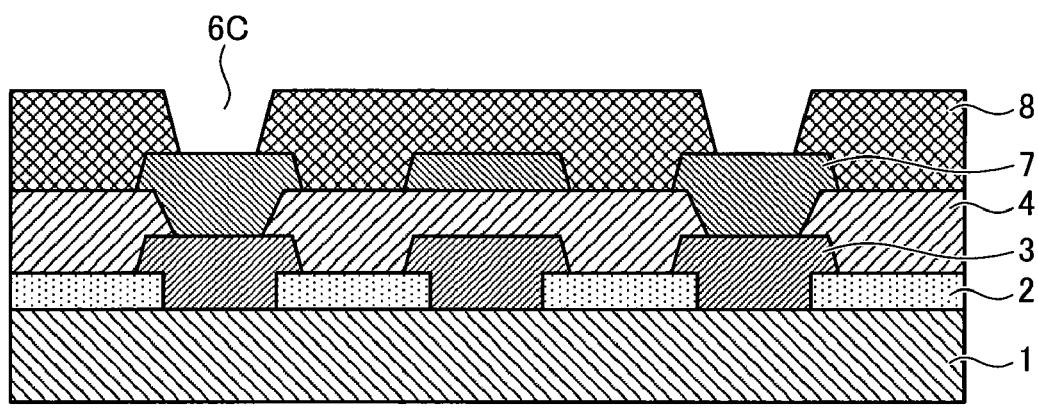
FIG. 5 is a schematic cross-sectional view for explaining a step of manufacturing the semiconductor device having the multilayer wiring structure according to the embodiment of the present invention.

A surface-protecting film layer 8 is then formed. In the example shown in FIGS. 1 to 5, the surface-protecting film layer 8 is formed as follows. That is, the photosensitive resin composition according to the present invention is applied by a spin coating method and dried, and irradiated with light through a mask having a pattern for forming windows 6C at predetermined portions, and then developed using an alkaline aqueous solution to form a patterned resin film. The patterned resin film is then heated to obtain a polybenzoxazole patterned hardened film as the surface-protecting film layer 8 (fifth step; FIG. 5). The surface-protecting film layer (polybenzoxazole patterned hardened film) 8 protects the conductor layer from an external stress, an α-ray or the like, to render the resultant semiconductor device excellent in reliability.

In the present invention, at the heating step which has conventionally required heating at a temperature as high as about 350° C. for forming the polybenzoxazole film, hardening can be made using heating at a temperature as low as 280° C. or less. Since the photosensitive resin composition according to the present invention causes a cyclodehydration reaction satisfactorily even in the hardening at 280° C. or lower, the resultant film has a small change in properties (such as extension, water absorption, weight loss temperature, and outgas), as compared to a film hardened at 300° C. or higher. Therefore, the temperature for the process can be lowered, so that the device is prevented from suffering defects due to heat, making it possible to obtain a semiconductor device (electronic part) having excellent reliability in high yield.

In the aforementioned example, the interlayer inslating film may be formed using the photosensitive resin composition according to the present invention.

[Electronic Part]

Subsequently, the electronic part according to the present invention will be described. The electronic part according to the present invention has a pattern formed by the aforementioned method for manufacturing a pattern using the aforementioned photosensitive resin composition. Examples of electronic parts may include semiconductor devices, multilayer wiring boards, and various types of electronic devices. Particularly preferred examples may be an MRAM (Magnet Resistive Random Access Memory) having low heat resistance.

Specifically, the pattern can be used for forming a surface protecting film or interlayer inslating film of an electronic part, such as a semiconductor device, or an interlayer inslating film of a multilayer wiring board. With respect to the electronic part according to the present invention, there is no particular limitation as long as it has a surface protecting film or interlayer inslating film formed using the photosensitive resin composition, and the electronic part may be of various structures. For example, the photosensitive resin composition according to the present invention is preferably used in a surface protecting film of MRAM.

EXAMPLES

Subsequently, the present invention will be explained in more detail based on Examples and Comparative Examples. The present invention is not limited to the following Examples.

Synthesis Example 1

Synthesis of Polybenzoxazole Precursor 60 grams of N-methylpyrrolidone was charged into a 0.2-liter flask equipped with a stirrer and a thermometer, and 13.92 grams of 2,2'-bis(3-amino-4-hydroxyphenyl)hexafluoropropane was added to the N-methylpyrrolidone and dissolved by stirring. Subsequently, 5.64 grams of malonic acid dichloride was added dropwise to the resultant solution over 10 minutes while maintaining the temperature at 0 to 5° C., followed by stirring for 60 minutes. The resultant solution was poured in 3 liters of water, and the deposited material was collected and washed with pure water three times, and then subjected to vacuum drying to obtain polyhydroxyamide (polybenzoxazole precursor) (hereinafter referred to as "polymer P1"). The polymer P1 had a weight average molecular weight of 11,500, as measured by a GPC method with standard polystyrene conversion, and the degree of dispersion was 1.7.

Synthesis Example 2

A synthesis was conducted in the same conditions as in Synthesis Example 1 except that malonic acid dichloride used in Synthesis Example 1 was replaced by succinic acid dichloride. The obtained polyhydroxyamide (hereinafter referred to as "polymer P2") had a weight average molecular weight of 20,400, as measured with standard polystyrene conversion, and the degree of dispersion was 1.8.

Synthesis Example 3

A synthesis was conducted in the same conditions as in Synthesis Example 1 except that malonic acid dichloride used in Synthesis Example 1 was replaced by glutaric acid dichloride. The obtained polyhydroxyamide (hereinafter referred to as "polymer P3") had a weight average molecular weight of 12,800, as measured with standard polystyrene conversion, and the degree of dispersion was 1.7.

Synthesis Example 4

A synthesis was conducted in the same conditions as in Synthesis Example 1 except that malonic acid dichloride used in Synthesis Example 1 was replaced by adipic acid dichloride. The obtained polyhydroxyamide (hereinafter referred to as "polymer P4") had a weight average molecular weight of 29,300, as measured with standard polystyrene conversion, and the degree of dispersion was 1.9.

Synthesis Example 5

A synthesis was conducted in the same conditions as in Synthesis Example 1 except that malonic acid dichloride used in Synthesis Example 1 was replaced by suberic acid dichloride. The obtained polyhydroxyamide (hereinafter referred to as "polymer P5") had a weight average molecular weight of 36,900, as measured with standard polystyrene conversion, and the degree of dispersion was 2.0.

Synthesis Example 6

A synthesis was conducted in the same conditions as in Synthesis Example 1 except that malonic acid dichloride used in Synthesis Example 1 was replaced by sebacic acid dichloride. The obtained polyhydroxyamide (hereinafter referred to as "polymer P6") had a weight average molecular weight of 33,100, as measured with standard polystyrene conversion, and the degree of dispersion was 2.0.

Synthesis Example 7

A synthesis was conducted in the same conditions as in Synthesis Example 1 except that malonic acid dichloride used in Synthesis Example 1 was replaced by dodecanedioic acid dichloride. The obtained polyhydroxyamide (hereinafter referred to as "polymer P7") had a weight average molecular weight of 31,600, as measured with standard polystyrene conversion, and the degree of dispersion was 2.0.

Synthesis Example 8

A synthesis was conducted in the same conditions as in Synthesis Example 1 except that malonic acid dichloride used in Synthesis Example 1 was replaced by dimethylmalonic acid dichloride. The obtained polyhydroxyamide (hereinafter referred to as "polymer P8") had a weight average molecular weight of 22,200, as measured with standard polystyrene conversion, and the degree of dispersion was 1.8.

Synthesis Example 9

A synthesis was conducted in the same conditions as in Synthesis Example 1 except that malonic acid dichloride used in Synthesis Example 1 was replaced by hexafluoroglutaric acid dichloride. The obtained polyhydroxyamide (hereinafter referred to as "polymer P9") had a weight average molecular weight of 10,700, as measured with standard polystyrene conversion, and the degree of dispersion was 1.6.

Synthesis Example 10

A synthesis was conducted in the same conditions as in Synthesis Example 1 except that malonic acid dichloride and 2,2'-bis(3-amino-4-hydroxyphenyl)hexafluoropropane used in Synthesis Example 1 were replaced by glutaric acid dichloride and 2,2'-bis(3-amino-4-hydroxyphenyl)isopropylidene, respectively. The obtained polyhydroxyamide (hereinafter referred to as "polymer P10") had a weight average molecular weight of 16,400, as measured with standard polystyrene conversion, and the degree of dispersion was 1.6.

Synthesis Example 11

A synthesis was conducted in the same conditions as in Synthesis Example 1 except that malonic acid dichloride and 2,2'-bis(3-amino-4-hydroxyphenyl)hexafluoropropane used in Synthesis Example 1 were replaced by suberic acid dichloride and 2,2'-bis(3-amino-4-hydroxyphenyl)isopropylidene, respectively. The obtained polyhydroxyamide (hereinafter referred to as "polymer P11") had a weight average molecular weight of 33,400, as measured with standard polystyrene conversion, and the degree of dispersion was 2.0.

Synthesis Example 12

A synthesis was conducted in the same conditions as in Synthesis Example 1 except that malonic acid dichloride and 2,2'-bis(3-amino-4-hydroxyphenyl)hexafluoropropane used in Synthesis Example 1 were replaced by sebacic acid dichloride and 2,2'-bis(3-amino-4-hydroxyphenyl)isopropylidene, respectively. The obtained polyhydroxyamide (hereinafter referred to as "polymer P12") had a weight average molecular weight of 28,800, as measured with standard polystyrene conversion, and the degree of dispersion was 1.9.

Synthesis Example 13

A synthesis was conducted in the same conditions as in Synthesis Example 1 except that malonic acid dichloride and 2,2'-bis(3-amino-4-hydroxyphenyl)hexafluoropropane used in Synthesis Example 1 were replaced by dodecanedioic acid dichloride and 2,2'-bis(3-amino-4-hydroxyphenyl)isopropylidene, respectively. The obtained polyhydroxyamide (hereinafter referred to as "polymer P13") had a weight average molecular weight of 24,300, as measured with standard polystyrene conversion, and the degree of dispersion was 1.9.

Synthesis Example 14

A synthesis was conducted in the same conditions as in Synthesis Example 1 except that malonic acid dichloride and 2,2'-bis(3-amino-4-hydroxyphenyl)hexafluoropropane used in Synthesis Example 1 were replaced by dimethylmalonic acid dichloride and 2,2'-bis(3-amino-4-hydroxyphenyl)isopropylidene, respectively. The obtained polyhydroxyamide (hereinafter referred to as "polymer P14") had a weight average molecular weight of 29,100, as measured with standard polystyrene conversion, and the degree of dispersion was 1.9.

Synthesis Example 15

A synthesis was conducted in the same conditions as in Synthesis Example 3 except that a portion of the glutaric acid dichloride in an amount of 50 mol % used in Syntheis Example 3 was replaced by a corresponding amount of 4,4'-diphenyl ether dicarboxylic acid dichloride. The obtained polyhydroxyamide (hereinafter referred to as "polymer P15") had a weight average molecular weight of 34,800, as measured with standard polystyrene conversion, and the degree of dispersion was 2.0.

Synthesis Example 16

A synthesis was conducted in the same conditions as in Synthesis Example 8 except that a portion of the dimethylmalonic acid dichloride in an amount of 50 mol % used in Synthesis Example 8 was replaced by a corresponding amount of 4,4'-diphenyl ether dicarboxylic acid dichloride. The obtained polyhydroxyamide (hereinafter referred to as "polymer P16") had a weight average molecular weight of 36,200, as measured with standard polystyrene conversion, and the degree of dispersion was 2.0.

Synthesis Example 17

A synthesis was conducted in the same conditions as in Synthesis Example 6 except that a portion of the sebacic acid dichloride in an amount of 40 mol % used in Synthesis Example 6 was replaced by a corresponding amount of 4,4'-diphenyl ether dicarboxylic acid dichloride. The obtained polyhydroxyamide (hereinafter referred to as "polymer P17") had a weight average molecular weight of 45,100, as measured with standard polystyrene conversion, and the degree of dispersion was 2.0.

Synthesis Example 18

A synthesis was conducted in the same conditions as in Synthesis Example 7 except that a portion of the dodecanedioic acid dichloride in an amount of 40 mol % used in Synthesis Example 7 was replaced by a corresponding amount of 4,4'-diphenyl ether dicarboxylic acid dichloride. The obtained polyhydroxyamide (hereinafter referred to as "polymer P18") had a weight average molecular weight of 41,800, as measured with standard polystyrene conversion, and the degree of dispersion was 2.0.

Synthesis Example 19

A synthesis was conducted in the same conditions as in Synthesis Example 8 except that a portion of the dimethylmalonic acid dichloride in an amount of 50 mol % used in Synthesis Example 8 was replaced by a corresponding amount of 4,4'-diphenyl ether dicarboxylic acid dichloride and that 2,2'-bis(3-amino-4-hydroxyphenyl)hexafluoropropane was replaced by 2,2'-bis(3-amino-4-hydroxyphenyl)isopropylidene. The obtained polyhydroxyamide (hereinafter referred to as "polymer P19") had a weight average molecular weight of 36,200, as measured with standard polystyrene conversion, and the degree of dispersion was 2.0.

Synthesis Example 20

Into a 0.5-liter flask equipped with a stirrer and a thermometer were charged 15.48 grams of 4,4'-diphenyl ether dicarboxylic acid and 90 grams of N-methylpyrrolidone, and the flask was cooled to 5° C., and then 12.64 grams of thionyl chloride was added dropwise to the resultant mixture over 30 minutes to effect a reaction, to thereby obtain a solution of 4,4'-diphenyl ether dicarboxylic acid chloride. Separately, 87.5 grams of N-methylpyrrolidone was charged into a 0.5-liter flask equipped with a stirrer and a thermometer, and 18.31 grams of 2,2'-bis(3-amino-4-hydroxyphenyl)hexafluoropropane was added thereto and dissolved by stirring. Then 8.53 grams of pyridine was added to the resultant solution, and the obtained solution of 4,4'-diphenyl ether dicarboxylic acid chloride was added dropwise to the mixture over 30 minutes while maintaining the temperature at 0 to 5° C., followed by stirring for 30 minutes. The resultant solution was poured in 3 liters of water, and the deposited material was collected and washed with pure water three times, and then subjected to vacuum drying, to thereby obtain polyhydroxyamide (hereinafter referred to as "polymer P20"). The polymer P20 had a weight average molecular weight of 17,900, as measured with standard polystyrene conversion, and the degree of dispersion was 1.5.

Synthesis Example 21

A synthesis was conducted in the same conditions as in Synthesis Example 20 except that 1,3-bis(carboxypropyl)tetramethyldisiloxane and 2,2'-bis(3-amino-4-hydroxyphenyl) hexafluoropropane used in Synthesis Example 20 were replaced by 4,4'-diphenyl ether dicarboxylic acid and 2,2'-bis(3-amino-4-hydroxyphenyl) sulfone, respectively. The obtained polyhydroxyamide (hereinafter referred to as "polymer P21") had a weight average molecular weight of 13,700, as measured with standard polystyrene conversion, and the degree of dispersion was 1.5.

Synthesis Example 22

A synthesis was conducted in the same conditions as in Synthesis Example 20 except 1,3-bis(carboxypropyl)tetramethyldisiloxane used in Synthesis Example 20 was replaced by isophthalic acid. The obtained polyhydroxyamide (hereinafter referred to as "polymer P22") had a weight average molecular weight of 21,600, as measured with standard polystyrene conversion, and the degree of dispersion was 1.6.

(Conditions for Measurement of Weight Average Molecular Weight by GPC Method)
Apparatus: Detector L4000 UV, manufactured by Hitachi, Ltd.
Pump: L6000, manufactured by Hitachi, Ltd.
C—R4A Chromatopac, manufactured by Shimadzu Corporation
Conditions: Column Gelpack GL-S300MDT-5, 2 columns
Eluent:THF/DMF=1/1 (volume ratio)
LiBr (0.03 mol/l), $H_3PO_4$ (0.06 mol/l)
Flow rate: 1.0 ml/min, Detector: UV 270 nm
A solution of 0.5 milligram of a polymer in 1 milliliter of a solvent [THF/DMF=1/1 (volume ratio)] was used for measurement.

Examples 1 to 19 and Comparative Examples 1 to 3

10.0 grams of each of the polymers (P1 to P22) obtained in Synthesis Examples 1 to 22 was dissolved in 15 grams of N-methylpyrrolidone to obtain a resin solution, and the resin solution was applied onto a silicon wafer by spin coating and dried at 120° C. for 3 minutes to obtain a coating film (A) having a thickness of 12 micrometers. The coating film was heated at 150° C. in a nitrogen gas atmosphere in an inert gas oven, by Koyo Thermo System Co., Ltd., for 30 minutes, and then further heated at 200° C. for 1 hour or at 350° C. for 1 hour to obtain hardened films (a hardened film (B) obtained by heating at 200° C. and a hardened film (C) obtained by heating at 350° C.). With respect to each of the obtained coating film (A) and hardened films (B) and (C), an infrared absorption spectrum was measured, and absorbance of a peak appearing at around 1,540 $cm^{-1}$ ascribed to the C—N stretching vibration was determined. In the measurement of infrared absorption spectrum, FTIR-8300 (manufactured by Shimadzu Corporation) was used as a measurement apparatus. The cyclodehydration rate of the coating film (A) was presumed to be 0% and the cyclodehydration rate of the hardened film (C) was presumed to be 100%, and a cyclodehydration rate of the hardened film (B) was determined by making a calculation using the following equation.

Cyclodehydration rate of hardened film $(B)$=[(Absorbance of hardened film $(B)$–Absorbance of hardened film $(C)$)/(Absorbance of coating film $(A)$–Absorbance of hardened film $(C)$)]×100(%)

(Measurement of Transmittance)
10.0 grams of each of the polymers (P1 to P22) obtained in Synthesis Examples 1 to 22 was dissolved in 15 grams of N-methylpyrrolidone to obtain a resin solution, and the resin solution was applied onto a silicon wafer by spin coating and dried on a hot plate at 120° C. for 3 minutes to obtain a coating film having a thickness of 10 micrometers. With respect to the obtained coating film, transmittance of 365 nanometer wavelength (i-ray) through the 10 micrometer thickness film was measured by means of an ultraviolet-visible spectrophotometer (product name "U-3310", manufactured by Hitachi, Ltd.).

The cyclodehydration rates at 200° C. obtained using the aforementioned formula and i-ray transmittances through the 10 micrometer film thickness of the polymers are shown in Table 1.

TABLE 1

| Item | Polymer of component (a) | Cyclodehydration rate (%) | i-Ray transmittance (%) through 10 micrometer film thickness |
|---|---|---|---|
| Example 1 | P1 | 72 | 2 |
| Example 2 | P2 | 78 | 90 |
| Example 3 | P3 | 78 | 97 |
| Example 4 | P4 | 75 | 99 |
| Example 5 | P5 | 83 | 99 |
| Example 6 | P6 | 83 | 99 |
| Example 7 | P7 | 86 | 98 |
| Example 8 | P8 | 59 | 99 |
| Example 9 | P9 | 63 | 96 |
| Example 10 | P10 | 79 | 95 |
| Example 11 | P11 | 83 | 97 |
| Example 12 | P12 | 86 | 97 |
| Example 13 | P13 | 85 | 97 |
| Example 14 | P14 | 52 | 98 |
| Example 15 | P15 | 52 | 70 |
| Example 16 | P16 | 49 | 70 |
| Example 17 | P17 | 61 | 75 |
| Example 18 | P18 | 61 | 75 |
| Example 19 | P19 | 51 | 21 |
| Comparative example 1 | P20 | 26 | 50 |

TABLE 1-continued

| Item | Polymer of component (a) | Cyclo-dehydration rate (%) | i-Ray transmittance (%) through 10 micrometer film thickness |
|---|---|---|---|
| Comparative example 2 | P21 | 20 | 32 |
| Comparative example 3 | P22 | 15 | 66 |

From the aforementioned results, it has been found that the polymers in Examples 1 to 19 (P1 to P19) have a cyclodehydration rate at 200° C. of more than 50 to about 90%, which is remarkably higher than the cyclodehydration rate (15 to 26%) of the aromatic polybenzoxazole in Comparative Examples 1 to 3 (polymers P20 to P22). Further, it has been found that the polymers in Examples 2 to 18 have an i-ray transmittance through 10 micrometer thickness as high as 70% or more.

Examples 20 to 38 and Comparative Examples 4 to 6

Evaluation of Photosensitive Properties

The components (b), (c), and (d) and other components were added at the predetermined amounts shown in Table 2 below to 100 parts by weight of the polybenzoxazole precursor as the component (a), to obtain a solution of the photosensitive resin composition.

TABLE 2

| Item | Polymer of component (a) | Component (b) | Component (c) | Component (d) | Other components added |
|---|---|---|---|---|---|
| Ex. 20 | P1 | B1 (13) | NMP | D1 (10) | E1 (16) |
| Ex. 21 | P2 | B1 (11) | NMP | D1 (10) | E1 (15) |
| Ex. 22 | P3 | B1 (11) | NMP | D3 (10) | E1 (16) |
| Ex. 23 | P4 | B1 (10) | NMP | D3 (10) | E1 (15) |
| Ex. 24 | P5 | B1 (13) | NMP | D3 (10) | E1 (15) |
| Ex. 25 | P6 | B1 (11) | BLO/PGMEA | D2 (7.5) | E1 (7) |
| Ex. 26 | P7 | B1 (11) | BLO/PGMEA | D2 (7.5) | E1 (5) |
| Ex. 27 | P8 | B1 (11) | BLO/PGMEA | D2 (7.5) | E1 (14) |
| Ex. 28 | P9 | B1 (11) | NMP | D1 (10) | E1 (15) |
| Ex. 29 | P10 | B1 (11) | BLO/PGMEA | D2 (7.5) | E1 (14) |
| Ex. 30 | P11 | B1 (11) | NMP | D2 (7.5) | E1 (14) |
| Ex. 31 | P12 | B1 (12) | NMP | D2 (7.5) | E1 (6) |
| Ex. 32 | P13 | B1 (10) | NMP | D2 (7.5) | E1 (4) |
| Ex. 33 | P14 | B1 (10) | NMP | D1 (10) | E1 (14) |
| Ex. 34 | P15 | B1 (11) | BLO/PGMEA | D1 (10) | E1 (8) |
| Ex. 35 | P16 | B1 (12) | BLO/PGMEA | D1 (10) | E1 (7) |
| Ex. 36 | P17 | B1 (11) | BLO/PGMEA | D2 (7.5) | E1 (4) |
| Ex. 37 | P18 | B1 (11) | BLO/PGMEA | D2 (7.5) | E1 (2.5) |
| Ex. 38 | P19 | B1 (11) | NMP | D2 (7.5) | E1 (12) |
| Comp. Ex. 4 | P20 | B1 (11) | BLO/PGMEA | D1 (10) | E1 (1) |
| Comp. Ex. 5 | P21 | B1 (11) | NMP | D2 (7.5) | E1 (10) |
| Comp. Ex. 6 | P22 | B1 (15) | NMP | D1 (12) | E1 (12) |

In Table 2, BLO stands for γ-butyrolactone, PGMEA stands for propylene glycol monomethyl ether acetate, NMP stands for N-methylpyrrolidone, and BLO/PGMEA stands for a mixture of BLO and PGMEA. Numerical values in parentheses indicate an amount (parts by weight)}, relative to 100 parts by weight of the polymer. In Table 2, NMP means that it was added in an amount of 150 parts by weight, and BLO/PGMEA means that they were added in an amount ratio of 135/15 parts by weight.

Further, in Table 2, B1, D1, D2, D3, and E1 stand for compounds represented by the following chemical formulae (X), (XI), and (XII).

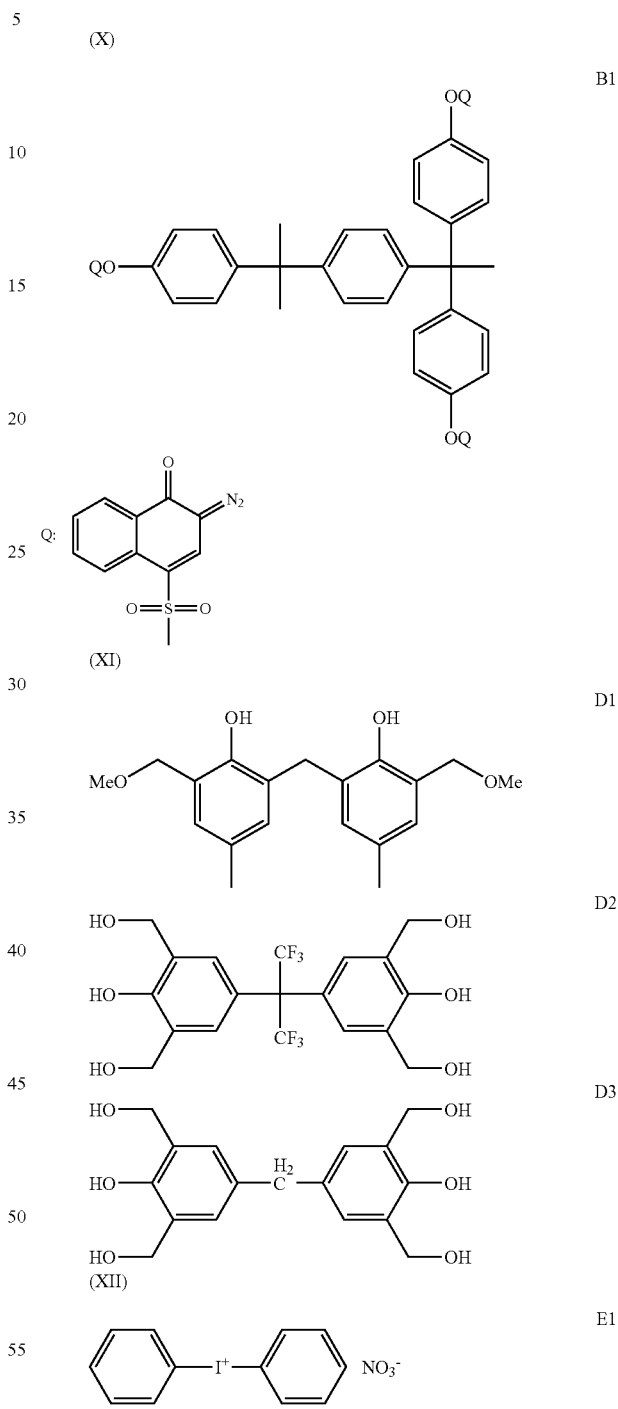

The obtained solution of the photosensitive resin composition was applied onto a silicon wafer by spin coating to form a coating film having a dry thickness of 10 to 15 micrometers, and the film was subjected to i-ray (365 nanometers) exposure using a stepper (product name "LD5010i"), manufactured by Hitachi, Ltd. After the light exposure, the resultant film was heated at 120° C. for 3 minutes, and developed using a 2.38% by weight aqueous solution of tetramethylammonium hydroxide until the silicon wafer was exposed at the irradiated portions, and then rinsed in water to determine a minimum light-exposure energy required for the patter formation and a resolution. The results are shown in Table 3.

TABLE 3

| Item | Sensitivity (mJ/cm$^2$) | Resolution (μm) |
|---|---|---|
| Example 20 | 680 | 5 |
| Example 21 | 400 | 5 |
| Example 22 | 410 | 3 |
| Example 23 | 400 | 3 |
| Example 24 | 400 | 3 |
| Example 25 | 360 | 3 |
| Example 26 | 360 | 3 |
| Example 27 | 400 | 5 |
| Example 28 | 440 | 5 |
| Example 29 | 390 | 3 |
| Example 30 | 400 | 3 |
| Example 31 | 380 | 3 |
| Example 32 | 380 | 3 |
| Example 33 | 360 | 5 |
| Example 34 | 420 | 5 |
| Example 35 | 380 | 5 |
| Example 36 | 380 | 3 |
| Example 37 | 360 | 3 |
| Example 38 | 520 | 5 |
| Comparative example 4 | 360 | 3 |
| Comparative example 5 | 400 | 3 |
| Comparative example 6 | 380 | 3 |

From the aforementioned results, it has been found that the photosensitive compositions in Examples 20 to 38 using the polymers (P1 to P19) exhibit high sensitivity and can form a positive pattern with a resolution of 5 micrometers or 3 micrometers which is the same level as those in Comparative Examples 4 to 6.

The obtained solution of the photosensitive resin composition was applied onto a silicon wafer by spin coating, and heated at 120° C. for 3 minutes to form a coating film having a thickness of 15 micrometers. The coating film was then heated at 150° C. in a nitrogen gas atmosphere in an inert gas oven, manufactured by Koyo Thermo System Co., Ltd., for 30 minutes, and then further heated at 320° C. for 1 hour, at 200° C. for 1 hour, or at 180° C. for 1 hour to obtain a hardened film. The hardened film was peeled off the wafer using a 4.9% aqueous solution of hydrofluoric acid, and washed with water and dried. Then properties of the hardened film including glass transition temperature (Tg), breaking extension, elastic modulus, electric permittivity, and 5% weight loss temperature were measured. Tg was determined using TMA/SS 6000, manufactured by Seiko Instruments Inc., from an inflection point of thermal expansion at a temperature elevation rate of 5° C./min. The breaking extension and elastic modulus were determined by a tensile test using Autograph AGS-100NH, manufactured by Shimadzu Corporation. The thermal decomposition temperature was measured using TG/DTA 6300, manufactured by Seiko Instruments Inc., under a nitrogen gas flow at 200 mL/min under conditions at a temperature elevation rate of 10° C./min, and a temperature at which the weight loss reached 5% was determined as a thermal decomposition temperature. The electric permittivity was determined as follows. An aluminum film was formed on the hardened film by a vacuum deposition machine (manufactured by ULVAC, Inc.), and an electric capacity of the resultant sample was measured using an apparatus that is an LF impedance analyzer (product name "HP4192A", manufactured by Yokogawa Electric Corporation) having a dielectric test fixture (product name "HP16451B", manufactured by Yokogawa Electric Corporation) connected thereto, under conditions at a frequency of 10 kHz. The electric capacity measured was applied to the equation described below to determine relative electric permittivity by calculation.

Relative electric permittivity=(Capacity measured×Thickness of hardened film)/(Vacuum permittivity×Area measured)

In addition, a cyclodehydration rate of the hardened film was measured in the same manner as mentioned above. The results of measurements of these properties are shown in Tables 4 and 5.

TABLE 4

| Item | Hardening temperature (° C.) | Tg (° C.) | Breaking extension (%) | Elastic modulus (GPa) |
|---|---|---|---|---|
| Example 20 | 180 | 152 | 7 | 3.2 |
|  | 200 | 182 | 6 | 3.1 |
|  | 320 | 212 | 7 | 3.2 |
| Example 21 | 180 | 163 | 8 | 3.3 |
|  | 200 | 197 | 7 | 3.3 |
|  | 320 | 210 | 7 | 3.0 |
| Example 22 | 180 | 169 | 8 | 2.7 |
|  | 200 | 183 | 19 | 3.6 |
|  | 320 | 180 | 13 | 3.7 |
| Example 23 | 180 | 166 | 7 | 2.4 |
|  | 200 | 169 | 20 | 2.0 |
|  | 320 | 172 | 16 | 2.1 |
| Example 24 | 180 | 138 | 12 | 1.9 |
|  | 200 | 134 | 21 | 1.7 |
|  | 320 | 132 | 12 | 1.8 |
| Example 25 | 180 | 107 | 116 | 1.9 |
|  | 200 | 101 | 63 | 1.3 |
|  | 320 | 102 | 40 | 1.4 |
| Example 26 | 180 | 95 | 106 | 1.6 |
|  | 200 | 89 | 88 | 1.0 |
|  | 320 | 88 | 49 | 1.1 |
| Example 27 | 180 | 142 | 7 | 3.4 |
|  | 200 | 186 | 5 | 3.2 |
|  | 320 | 179 | 10 | 3.0 |
| Example 28 | 180 | 161 | 5 | 4.1 |
|  | 200 | 211 | 6 | 3.7 |
|  | 320 | 208 | 9 | 3.7 |
| Example 29 | 180 | 168 | 10 | 2.7 |
|  | 200 | 152 | 13 | 2.9 |
|  | 320 | 147 | 19 | 2.6 |
| Example 30 | 180 | 130 | 20 | 2.0 |
|  | 200 | 120 | 28 | 1.5 |
|  | 320 | 126 | 28 | 1.4 |
| Example 31 | 180 | 80 | 98 | 1.6 |
|  | 200 | 73 | 89 | 1.0 |
|  | 320 | 76 | 69 | 1.2 |
| Example 32 | 180 | 70 | 105 | 1.0 |
|  | 200 | 65 | 110 | 0.7 |
|  | 320 | 66 | 105 | 0.8 |
| Example 33 | 180 | 123 | 5 | 3.2 |
|  | 200 | 140 | 5 | 2.9 |
|  | 320 | 148 | 8 | 2.7 |
| Example 34 | 180 | 123 | 6 | 2.4 |
|  | 200 | 165 | 15 | 2.1 |
|  | 320 | 196 | 13 | 1.7 |
| Example 35 | 180 | 119 | 6 | 2.8 |
|  | 200 | 182 | 7 | 2.7 |
|  | 320 | 190 | 9 | 2.3 |
| Example 36 | 180 | 167 | 20 | 2.9 |
|  | 200 | 189 | 21 | 2.5 |
|  | 320 | 187 | 27 | 2.2 |
| Example 37 | 180 | 179 | 35 | 2.2 |
|  | 200 | 175 | 32 | 2.1 |
|  | 320 | 161 | 38 | 1.8 |
| Example 38 | 180 | 120 | 6 | 2.6 |
|  | 200 | 142 | 7 | 2.9 |
|  | 320 | 145 | 6 | 2.4 |
| Comparative example 4 | 180 | 172 | 7 | 3.5 |
|  | 200 | 220 | 5 | 3.0 |
|  | 320 | 305 | 50 | 2.1 |

TABLE 4-continued

| Item | Hardening temperature (° C.) | Tg (° C.) | Breaking extension (%) | Elastic modulus (GPa) |
|---|---|---|---|---|
| Comparative example 5 | 180 | 140 | 8 | 3.5 |
|  | 200 | 167 | 7 | 3.2 |
|  | 320 | 215 | 12 | 2.3 |
| Comparative example 6 | 180 | 169 | 2 | 2.9 |
|  | 200 | 205 | 3 | 2.7 |
|  | 320 | 203 | 16 | 1.9 |

TABLE 5

| Item | Hardening temperature (° C.) | Electric permittivity | 5% Weight loss temperature (° C.) | Cyclodehydration rate (%) |
|---|---|---|---|---|
| Example 20 | 180 | 3.3 | 252 | 79 |
|  | 200 | 2.9 | 306 | 95 |
|  | 320 | 2.8 | 320 | 100 |
| Example 21 | 180 | 3.2 | 275 | 81 |
|  | 200 | 2.9 | 321 | 98 |
|  | 320 | 2.8 | 383 | 100 |
| Example 22 | 180 | 2.9 | 387 | 92 |
|  | 200 | 2.8 | 405 | 98 |
|  | 320 | 2.8 | 416 | 100 |
| Example 23 | 180 | 2.9 | 350 | 93 |
|  | 200 | 2.7 | 400 | 100 |
|  | 320 | 2.8 | 424 | 100 |
| Example 24 | 180 | 2.8 | 382 | 98 |
|  | 200 | 2.8 | 404 | 100 |
|  | 320 | 2.7 | 423 | 100 |
| Example 25 | 180 | 2.8 | 423 | 96 |
|  | 200 | 2.7 | 433 | 100 |
|  | 320 | 2.8 | 429 | 100 |
| Example 26 | 180 | 2.8 | 381 | 98 |
|  | 200 | 2.8 | 435 | 100 |
|  | 320 | 2.8 | 428 | 100 |
| Example 27 | 180 | 3.3 | 281 | 65 |
|  | 200 | 3.1 | 381 | 82 |
|  | 320 | 2.9 | 360 | 100 |
| Example 28 | 180 | 3.3 | 271 | 62 |
|  | 200 | 3.0 | 407 | 86 |
|  | 320 | 2.7 | 450 | 100 |
| Example 29 | 180 | 3.1 | 305 | 92 |
|  | 200 | 3.0 | 371 | 100 |
|  | 320 | 2.9 | 368 | 100 |
| Example 30 | 180 | 3.0 | 312 | 92 |
|  | 200 | 2.9 | 350 | 100 |
|  | 320 | 2.8 | 383 | 100 |
| Example 31 | 180 | 2.9 | 329 | 96 |
|  | 200 | 2.7 | 345 | 100 |
|  | 320 | 2.8 | 389 | 100 |
| Example 32 | 180 | 2.7 | 364 | 100 |
|  | 200 | 2.7 | 367 | 100 |
|  | 320 | 2.7 | 382 | 100 |
| Example 33 | 180 | 3.4 | 265 | 63 |
|  | 200 | 3.2 | 300 | 89 |
|  | 320 | 2.9 | 302 | 100 |
| Example 34 | 180 | 3.7 | 243 | 51 |
|  | 200 | 3.4 | 340 | 75 |
|  | 320 | 2.9 | 427 | 100 |
| Example 35 | 180 | 3.8 | 232 | 50 |
|  | 200 | 3.4 | 313 | 71 |
|  | 320 | 2.9 | 368 | 100 |
| Example 36 | 180 | 3.5 | 245 | 65 |
|  | 200 | 3.3 | 331 | 83 |
|  | 320 | 2.8 | 430 | 100 |
| Example 37 | 180 | 3.4 | 266 | 78 |
|  | 200 | 3.2 | 346 | 88 |
|  | 320 | 2.8 | 438 | 100 |
| Example 38 | 180 | 3.7 | 244 | 53 |
|  | 200 | 3.4 | 301 | 79 |
|  | 320 | 2.9 | 356 | 100 |
| Comparative example 4 | 180 | 4.2 | 184 | 12 |
|  | 200 | 3.8 | 266 | 42 |
|  | 320 | 3.0 | 500 | 90 |
| Comparative example 5 | 180 | 4.4 | 173 | 15 |
|  | 200 | 3.9 | 221 | 43 |
|  | 320 | 3.2 | 480 | 87 |
| Comparative example 6 | 180 | 4.6 | 159 | 9 |
|  | 200 | 4.0 | 208 | 38 |
|  | 320 | 3.6 | 502 | 88 |

The aforementioned results have confirmed that the resin compositions in Examples 20 to 38, which are the photosensitive resin composition according to the present invention, have a smaller difference between the Tg and breaking extension of the film hardened at 180 or 200° C. and that of the film hardened at 320° C. than the difference as to the resin compositions in Comparative Examples 4 to 6, and hence have a level of film properties similar to the comparative examples.

With respect to the 5% weight loss temperatures, those of the films hardened respectively at 180° C. and 200° C. were lower than that of the film hardened at 320° C. However, the 5% weight loss temperature of the film hardened at 180° C. was 230° C. or higher and that of the film hardened at 200° C. was 300° C. or higher, which are higher than those for the resin compositions in Comparative Examples 4 to 6.

As to the resin compositions of Examples 20 to 38, the cyclodehydration rate of the film hardened at 180° C. was equal to or more than 50%, and the cyclodehydration rate of the film hardened at 200° C. was as high as 70% or more. As to the resin compositions of Examples 25, 26, 31, 32, 36, and 37 using a polymer having an alkyl chain length of equal to or more than 7 in the polybenzoxazole skeleton, the breaking extension values of the films hardened at 180° C., 200° C., and 320° C. were equal to or more than 10%, which are very high, as compared to those for the resin compositions in Comparative Examples 4 to 6. Further, as to the resin compositions of Examples 25, 26, 31, and 32, the elastic modulus values of the films hardened at 180° C., 200° C., and 320° C. were advantageously as low as 2.0 GPa or less, and the electric permittivity values of these films were also advantageously as low as 3.0 or less.

On the other hand, as to the resin compositions of Comparative Examples 4 to 6, the film hardened at 200° C. had such a low cyclodehydration rate of equal to or less than 42% that the cyclodehydration reaction proceeded unsatisfactorily, and hence had electric permittivity of as high as 3.8 or more and a 5% weight loss temperature of as low as 266° C. or less. Similarly, as to the resin compositions of Comparative Examples 4 to 6, the film hardened at 180° C. had such a low cyclodehydration rate of equal to or less than 15% that the cyclization proceeded unsatisfactorily, and hence had electric permittivity of as high as 4.0 or more and a 5% weight loss temperature of as low as 200° C. or less.

As described above, even when the photosensitive resin composition according to the present invention is used in a lower temperature hardening process, a patterned hardened film having excellent heat resistance and a favorable form can be obtained, and therefore the resin composition is suitably used in production of an electronic part, particularly production of an MRAM that requires low temperature hardening.

To the solutions prepared in Examples 20 to 38 and Comparative Examples 4 to 6 was further added the component (e) (thermal acid generator) at the amount shown in Table 6. In Table 6, d1 to d4 in the column of the component (e) stand for compounds represented by the chemical formula (XIII)

described below. The resultant solution of the photosensitive resin composition was applied onto a silicon wafer by spin coating, and heated at 120° C. for 3 minutes to form a coating film having a thickness of 15 micrometers. The coating film was then heated at 150° C. in a nitrogen gas atmosphere in an inert gas oven for 30 minutes, and then further heated at 200° C. for 1 hour, at 180° C. for 1 hour, or at 160° C. for 1 hour to obtain a hardened film. Cyclodehydration rates of the films obtained by heating at 200° C., 180° C., or 160° C. for 1 hour were measured. Further, each of the hardened films was immersed in acetone, BLO (γ-butyrolactone), or NMP (N-methylpyrrolidone) at room temperature for 15 minutes, and observed for finding change of the hardened film. The results are also shown in Table 6. In Table 6, the hardened film which had a crack in it is rated "Bad", and the hardened film which had no crack is rated "Good".

TABLE 6

| Item | Component (e) | Hardening temperature (° C.) | Cyclo-dehydration rate (%) | Acetone | BLO | NMP |
|---|---|---|---|---|---|---|
| Ex. 20 | d4 (3) | 160 | 24 | Bad | Bad | Bad |
|  |  | 180 | 90 | Bad | Bad | Bad |
|  |  | 200 | 100 | Bad | Good | Bad |
| Ex. 21 | d4 (3) | 160 | 28 | Bad | Bad | Bad |
|  |  | 180 | 90 | Bad | Bad | Bad |
|  |  | 200 | 100 | Bad | Good | Bad |
| Ex. 22 | d4 (3) | 160 | 30 | Bad | Good | Good |
|  |  | 180 | 96 | Bad | Good | Good |
|  |  | 200 | 100 | Bad | Good | Good |
| Ex. 23 | d3 (3) | 160 | 32 | Bad | Good | Good |
|  |  | 180 | 97 | Bad | Good | Good |
|  |  | 200 | 100 | Bad | Good | Good |
| Ex. 24 | d4 (3) | 160 | 35 | Bad | Good | Good |
|  |  | 180 | 99 | Good | Good | Good |
|  |  | 200 | 100 | Good | Good | Good |
| Ex. 25 | d1 (3) | 160 | 40 | Good | Good | Good |
|  |  | 180 | 97 | Good | Good | Good |
|  |  | 200 | 100 | Good | Good | Good |
| Ex. 26 | d1 (3) | 160 | 56 | Good | Good | Good |
|  |  | 180 | 99 | Good | Good | Good |
|  |  | 200 | 100 | Good | Good | Good |
| Ex. 27 | d2 (3) | 160 | 32 | Bad | Bad | Bad |
|  |  | 180 | 80 | Bad | Bad | Bad |
|  |  | 200 | 91 | Bad | Bad | Bad |
| Ex. 28 | d2 (3) | 160 | 30 | Bad | Bad | Bad |
|  |  | 180 | 82 | Bad | Bad | Bad |
|  |  | 200 | 93 | Bad | Bad | Bad |
| Ex. 29 | d4 (3) | 160 | 33 | Bad | Good | Good |
|  |  | 180 | 97 | Bad | Good | Good |
|  |  | 200 | 100 | Bad | Good | Good |
| Ex. 30 | d1 (3) | 160 | 40 | Bad | Good | Bad |
|  |  | 180 | 98 | Good | Good | Good |
|  |  | 200 | 100 | Good | Good | Good |
| Ex. 31 | d1 (3) | 160 | 45 | Good | Good | Good |
|  |  | 180 | 100 | Good | Good | Good |
|  |  | 200 | 100 | Good | Good | Good |
| Ex. 32 | d1 (3) | 160 | 59 | Good | Good | Good |
|  |  | 180 | 100 | Good | Good | Good |
|  |  | 200 | 100 | Good | Good | Good |
| Ex. 33 | d4 (3) | 160 | 34 | Bad | Bad | Bad |
|  |  | 180 | 93 | Bad | Bad | Bad |
|  |  | 200 | 99 | Bad | Bad | Bad |
| Ex. 34 | d3 (3) | 160 | 27 | Bad | Bad | Bad |
|  |  | 180 | 70 | Bad | Bad | Bad |
|  |  | 200 | 79 | Bad | Bad | Bad |
| Ex. 35 | d2 (3) | 160 | 21 | Bad | Bad | Bad |
|  |  | 180 | 70 | Bad | Bad | Bad |
|  |  | 200 | 77 | Bad | Bad | Bad |
| Ex. 36 | d1 (3) | 160 | 30 | Bad | Bad | Bad |
|  |  | 180 | 81 | Bad | Bad | Bad |
|  |  | 200 | 90 | Bad | Bad | Bad |
| Ex. 37 | d1 (3) | 160 | 32 | Bad | Bad | Bad |
|  |  | 180 | 86 | Bad | Bad | Bad |
|  |  | 200 | 94 | Bad | Bad | Bad |
| Ex. 38 | d2 (3) | 160 | 21 | Bad | Bad | Bad |
|  |  | 180 | 75 | Bad | Bad | Bad |
|  |  | 200 | 82 | Bad | Bad | Bad |
| Comp. Ex. 4 | d2 (3) | 160 | 6 | Bad | Bad | Bad |
|  |  | 180 | 32 | Bad | Bad | Bad |
|  |  | 200 | 58 | Bad | Bad | Bad |
| Comp. Ex. 5 | d2 (3) | 160 | 3 | Bad | Bad | Bad |
|  |  | 180 | 39 | Bad | Bad | Bad |
|  |  | 200 | 59 | Bad | Bad | Bad |
| Comp. Ex. 6 | d2 (3) | 160 | 5 | Bad | Bad | Bad |
|  |  | 180 | 25 | Bad | Bad | Bad |
|  |  | 200 | 49 | Bad | Bad | Bad |

(XIII)

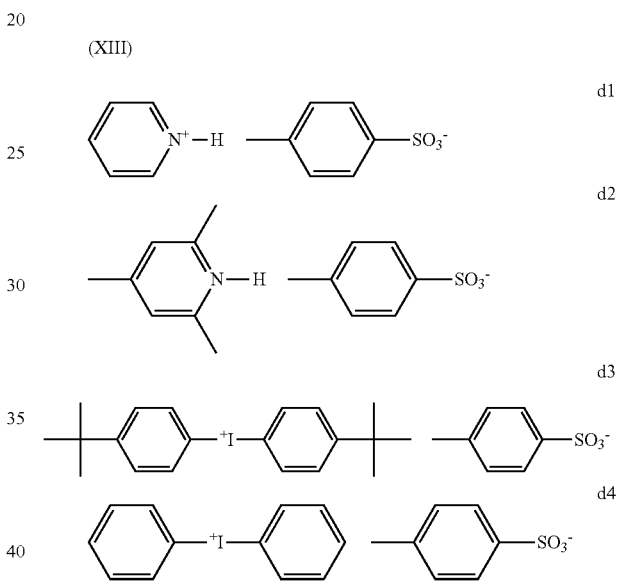

As is clear from Table 6, co-use of a thermal acid generator in the resin compositions in Examples 20 to 38 results in a considerably elevated cyclodehydration rate even the film hardened at 180° C., as compared to the film containing no thermal acid generator. The film hardened at a lower temperature achieved a cyclization rate of as high as 70% or more. As to the resin compositions in Comparative Examples 4 to 6, the cyclodehydration rate was 39% or less, which was insufficient. Further, as to the resin compositions in Examples 20 to 38, even the film hardened at 160° C. had a cyclization rate of as high as 20 to 60%, which is higher than the cyclization rate (equal to or less than 10%) of the corresponding films of the resin compositions in Comparative Examples 4 to 6.

With respect to the resistance to chemicals, the resin compositions of Comparative Examples 4 to 6 resulted in cracks after being immersed in any of the solvents. The resin compositions of Examples 22 to 24, 29, and 30 resulted in cracks when immersed in acetone, and when hardened at 160° C. and immersed in NMP. However, the films exhibited excellent chemical resistance against BLO. As to the resin compositions of Examples 25, 26, 31, and 32, the films hardened at 160, 180, and 200° C. exhibited excellent chemical resistance against any of acetone, BLO, and NMP.

Examples 39 to 44

Evaluation of Crack Resistance and Swell Resistance

The components (b), (c), (d), and (e) were added at the predetermined amounts shown in Table 7 described below [numerals in parentheses shown in Table 7 indicate an amount (parts by weight), relative to 100 parts by weight of the polymer] to 100 parts by weight of the polybenzoxazole precursor (polymer P6, P6, P7, P8, P10, or P13) as the component (a), to obtain a photosensitive resin composition. The solution of the photosensitive resin composition was applied onto a silicon wafer by spin coating, and heated at 120° C. for 3 minutes to form a coating film having a thickness of 15 micrometers. The coating film was then heated at 150° C. in a nitrogen gas atmosphere in an inert gas oven, manufactured by Koyo Thermo System Co., Ltd., for 30 minutes, and then further heated at 200° C. for 1 hour, at 180° C. for 1 hour, or at 160° C. for 1 hour to obtain a hardened film.

TABLE 7

| Item | Component (a) | Component (b) | Component (c) | Component (d) | Component (e) |
|---|---|---|---|---|---|
| Example 39 | P6 | B1 (11) | BLO/PGMEA | D4 (7.5) | d1 (3) |
| Example 40 | P6 | B1 (11) | BLO/PGMEA | D4 (20) | d1 (3) |
| Example 41 | P7 | B1 (11) | BLO/PGMEA | D5 (30) | d2 (3) |
| Example 42 | P8 | B1 (11) | BLO/PGMEA | D4 (20) | d1 (3) |
| Example 43 | P10 | B1 (11) | BLO/PGMEA | D5 (30) | d2 (3) |
| Example 44 | P13 | B1 (10) | BMP | D2 (20) | d1 (3) |

In Table 7, B1, BLO, PGMEA, NMP, D2, d1, and d2 stand for the same compounds as those mentioned above, and D4 and D5 are compounds represented by the chemical formula (XIV) described below. In Table 7, NMP means that it was added in an amount of 150 parts by weight, and BLO/PGMEA means that they were added in an amount ratio of 135/15 parts by weight.

(XIV)

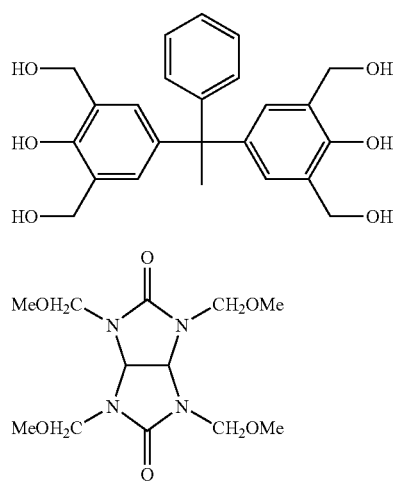

The hardened films obtained in Examples 39 to 44 and the hardened films obtained in Examples 25, 26, 31, and 32 were immersed in each of the aforementioned three types of solvents, and checked as to whether each hardened film had a crack on it, and whether each hardened film suffered swelling. The results are shown in the following Table 8.

TABLE 8

| Item | Hardening temperature (° C.) | With or without crack | | | With or without swelling | | |
|---|---|---|---|---|---|---|---|
| | | Acetone | BLO | NMP | Acetone | BLO | NMP |
| Example 25 | 160 | Good | Good | Good | Bad | Bad | Bad |
| | 180 | Good | Good | Good | Bad | Good | Bad |
| | 200 | Good | Good | Good | Good | Good | Bad |
| Example 26 | 160 | Good | Good | Good | Bad | Bad | Bad |
| | 180 | Good | Good | Good | Good | Good | Bad |
| | 200 | Good | Good | Good | Good | Good | Bad |
| Example 31 | 160 | Good | Good | Good | Bad | Bad | Bad |
| | 180 | Good | Good | Good | Good | Good | Bad |
| | 200 | Good | Good | Good | Good | Good | Bad |
| Example 32 | 160 | Good | Good | Good | Bad | Bad | Bad |
| | 180 | Good | Good | Good | Bad | Good | Bad |
| | 200 | Good | Good | Good | Good | Good | Bad |
| Example 39 | 160 | Bad | Good | Bad | Bad | Bad | Bad |
| | 180 | Bad | Good | Good | Bad | Good | Bad |
| | 200 | Good | Good | Good | Bad | Good | Bad |
| Example 40 | 160 | Bad | Good | Bad | Bad | Good | Bad |
| | 180 | Bad | Good | Good | Good | Good | Good |
| | 200 | Good | Good | Good | Good | Good | Good |
| Example 41 | 160 | Bad | Good | Good | Bad | Good | Bad |
| | 180 | Good | Good | Good | Good | Good | Good |
| | 200 | Good | Good | Good | Good | Good | Good |
| Example 42 | 160 | Bad | Good | Good | Bad | Good | Bad |
| | 180 | Good | Good | Good | Bad | Good | Bad |
| | 200 | Good | Good | Good | Good | Good | Good |
| Example 43 | 160 | Good | Good | Good | Bad | Good | Bad |
| | 180 | Good | Good | Good | Good | Good | Good |
| | 200 | Good | Good | Good | Good | Good | Good |
| Example 44 | 160 | Good | Good | Good | Good | Good | Good |
| | 180 | Good | Good | Good | Good | Good | Good |
| | 200 | Good | Good | Good | Good | Good | Good |

In Table 8, the hardened film which had a crack on it or suffered swelling is rated "Bad", and the hardened film which had no crack or suffered no swelling is rated "Good". When a hardened film was increased in thickness by equal to or more than 1 micrometer after immersed in the solvent, the film was judged as the one having swelling.

As can be understood from Table 8, in the present invention, when the amount of the component (d) relative to 100 parts by weight of the component (a) is set to 20 parts by weight or more (Examples 40 to 44), irrespective of the species of the polymer, the formation of cracks in the hardened film immersed in the solvent is suppressed, and further the hardened film immersed in the solvent is unlikely to suffer swelling, thus achieving remarkably improved resistance to chemicals.

As described above, the photosensitive resin composition according to the present invention is suitably used in forming, for example, a surface protecting film or interlayer inslating film of an electronic part, such as a semiconductor device, or an interlayer inslating film of a multilayer wiring board.

INDUSTRIAL APPLICABILITY

In the photosensitive resin composition according to the present invention, a specific polybenzoxazole photosensitive resin film exhibiting high cyclodehydration rate even at a low temperature is used as a base resin, and therefore a hardened film of the resin composition has properties comparable to those of a film hardened at a high temperature. In the method for manufacturing a pattern according to the present invention, by using the aforementioned photosensitive resin composition, there can be obtained a patterned hardened film that is advantageous not only in that it has excellent sensitivity, resolution, and adhesion, but also in that, even formed in a low temperature hardening process, the patterned hardened film has excellent heat resistance, low water absorption, and a favorable form. The patterned hardened film obtained from the photosensitive resin composition according to the present invention has a favorable form and adhesion, and excellent heat resistance, and further can be formed by hardening in a low temperature process and hence suppresses damages to a device, making it possible to obtain an electronic part with high reliability. Therefore, the photosensitive resin composition according to the present invention is advantageously used in an electronic part of an electronic device or the like, and is particularly suitable to a magnetoresistive memory.

The invention claimed is:

1. A photosensitive resin composition, comprising:
   (a) a polybenzoxazole precursor having a repeating unit represented by a general formula (II)

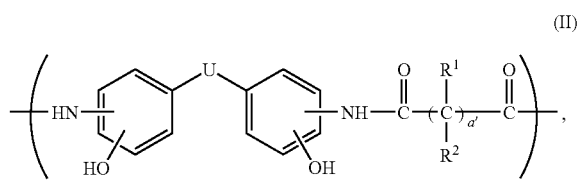

wherein each of $R^1$ and $R^2$ independently represents hydrogen, fluorine, or an alkyl group having 1 to 6 carbon atoms, U represents a divalent organic group, and a' represents an integer of 1 to 30;
   (b) a photo sensitizer;
   (c) a solvent; and
   (d) a crosslinking agent capable of causing crosslinking or polymerization by heating.

2. The photosensitive resin composition according to claim 1, wherein in the general formula (II) for the component (a), a' is 7 to 30.

3. The photosensitive resin composition according to claim 1, wherein the component (b) is a photosensitizer that generates acid or radicals by irradiation with light.

4. The photosensitive resin composition according to claim 1, wherein the component (d) is a compound having a methylol group or an alkoxyalkyl group.

5. The photosensitive resin composition according to claim 1, wherein the component (d) is used in an amount of equal to or more than 15 parts by weight, relative to 100 parts by weight of the component (a).

6. The photosensitive resin composition according to claim 1, further comprising as a component (e) a thermal acid generator that generates acid by heating.

7. A polybenzoxazole film formed using the photosensitive resin composition according to claim 1 by cyclodehydration of the polybenzoxazole precursor contained in the photosensitive resin composition.

8. A method for manufacturing a patterned hardened film, comprising the steps of:
   applying the photosensitive resin composition according to claim 1 to a substrate, and drying the resin composition to form a photosensitive resin film;
   subjecting the photosensitive resin film to light exposure with a predetermined pattern;
   developing, after the light exposure, the photosensitive resin film using an alkaline aqueous solution to obtain a patterned resin film; and
   subjecting the patterned resin film to heating treatment to obtain a patterned hardened film.

9. The method for manufacturing a patterned hardened film according to claim 8, wherein the heating treatment is performed by irradiating the patterned resin film with a microwave in a pulse form while changing a frequency of the microwave.

10. The method for manufacturing a patterned hardened film according to claim 8, wherein at the heating treatment of the developed photosensitive resin film, a heating treatment temperature is equal to or less than 280° C.

11. The method for manufacturing a patterned hardened film according to claim 8, wherein at the heating treatment of the developed photosensitive resin film, a heating treatment temperature is equal to or less than 230° C.

12. A photosensitive resin composition, comprising:
   (a) a copolymer of a polybenzoxazole precursor having an A structure unit and a B structure unit represented by a general formula (III),

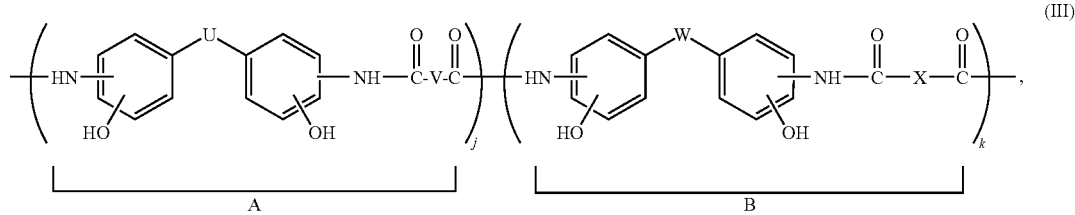

wherein each of U, V, W, and X represents a divalent organic group, at least one of U and V is a group containing an aliphatic chain structure having 1 to 30 carbon atoms, j and k represent molar fractions of the A structure unit and the B structure unit, respectively, and the sum of j and k is 100 mol %;
   (b) a photosensitizer;
   (c) a solvent; and
   (d) a crosslinking agent capable of causing crosslinking or polymerization by heating,
   wherein the component (a) is represented by a general formula (IV),

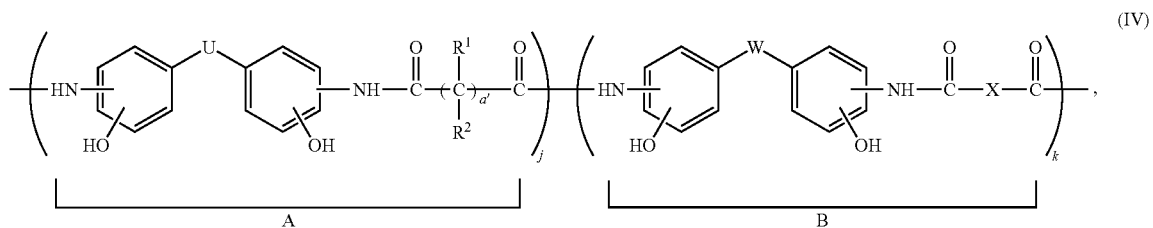

wherein each of R¹ and R² independently represents hydrogen, fluorine, or an alkyl group having 1 to 6 carbon atoms, each of U, W, and X represents a divalent organic group, j and k represent molar fractions of the A structure unit and the B structure unit, respectively, the sum of j and k is 100 mol %, and a' represents an integer of 1 to 30.

13. The photosensitive resin composition according to claim 12, wherein in the general formula (IV) for the component (a), a' is 7 to 30.

14. The photosensitive resin composition according to claim 12, wherein the component (b) is a photosensitizer that generates acid or radicals by irradiation with light.

15. The photosensitive resin composition according to claim 12, wherein the component (d) is a compound having a methylol group or an alkoxyalkyl group.

16. The photosensitive resin composition according to claim 12, wherein the component (d) is used in an amount of equal to or more than 15 parts by weight, relative to 100 parts by weight of the component (a).

17. The photosensitive resin composition according to claim 12, further comprising as a component (e) a thermal acid generator that generates acid by heating.

18. A polybenzoxazole film formed using the photosensitive resin composition according to claim 12 by cyclodehydration of the polybenzoxazole precursor contained in the photosensitive resin composition.

19. A method for manufacturing a patterned hardened film, comprising the steps of:
   applying the photosensitive resin composition according to claim 12 to a substrate and drying the resin composition to form a photosensitive resin film;
   subjecting the photosensitive resin film to light exposure with a predetermined pattern;
   developing, after the light exposure, the photosensitive resin film using an alkaline aqueous solution to obtain a patterned resin film; and
   subjecting the patterned resin film to heating treatment to obtain a patterned hardened film.

20. The method for manufacturing a patterned hardened film according to claim 19, wherein the heating treatment is performed by irradiating the patterned resin film with a microwave in a pulse form while changing a frequency of the microwave.

21. The method for manufacturing a patterned hardened film according to claim 19, wherein at the heating treatment of the developed photosensitive resin film, a heating treatment temperature is equal to or less than 280° C.

22. The method for manufacturing a patterned hardened film according to claim 19, wherein at the heating treatment of the developed photosensitive resin film, a heating treatment temperature is equal to or less than 230° C.

23. An electronic part having a patterned hardened film, obtained by the method for manufacturing a patterned hardened film according to claim 19, as at least one of an interlayer insulating-film layer and a surface-protecting film layer.

24. The electronic part according to claim 23, wherein the electronic part is a magnetoresistive memory.

\* \* \* \* \*